(12) United States Patent
Qama et al.

(10) Patent No.: US 10,690,517 B2
(45) Date of Patent: Jun. 23, 2020

(54) SENSOR COIL OPTIMIZATION

(71) Applicant: Integrated Device Technology, Inc., San Jose, CA (US)

(72) Inventors: Gentjan Qama, Munich (DE); Mauro Passarotto, Anguillara Veneta (IT); Ruben Specogna, Pagnacco (IT)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 16/024,298

(22) Filed: Jun. 29, 2018

(65) Prior Publication Data

US 2019/0128702 A1 May 2, 2019

Related U.S. Application Data

(60) Provisional application No. 62/580,354, filed on Nov. 1, 2017.

(51) Int. Cl.
G01R 33/00 (2006.01)
G01D 5/20 (2006.01)

(52) U.S. Cl.
CPC ......... *G01D 5/2046* (2013.01); *G01D 5/2053* (2013.01); *G01D 5/2073* (2013.01); *G01R 33/0017* (2013.01)

(58) Field of Classification Search
CPC .. G01D 5/2046; G01D 5/2053; G01D 5/2073; G01R 33/0017
USPC .................................................. 324/207.17
See application file for complete search history.

(56) References Cited

U.S. PATENT DOCUMENTS

| 8,421,447 B2 * | 4/2013 | Inoue ..................... G01B 7/003 324/207.16 |
| 8,928,311 B2 * | 1/2015 | Sasaki .................. G01D 5/2073 324/207.17 |
| 2014/0218036 A1 | 8/2014 | Fry |
| 2015/0339421 A1 | 11/2015 | Srinivasan et al. |

FOREIGN PATENT DOCUMENTS

EP 1975570 B1 10/2014

OTHER PUBLICATIONS

Bettini et al., "A Boundary Integral Method for Computing Eddy Currents in Thin Conductors for Arbitrary Topology," IEEE Transactions on Magnetics, vol. 41, No. 3. 2015. 4 pages.
Bettini et al., "A Volume Integral Formulation for Solving Eddy Current Problems on Polyhedral Messes," IEEE Transactions on Magnetics, vol. 53, No. 6. 2017. 4 pages.
S. Rao, "Engineering Optimization: Theory and Practice," John Wiley & Sons, 4th edition, 2009. 830 pages.

(Continued)

*Primary Examiner* — Reena Aurora
(74) *Attorney, Agent, or Firm* — Haynes and Boone, LLP

(57) ABSTRACT

In some embodiments, a coil design system is provided. In particular, a method of providing an optimized position locating sensor coil design in presented. The method includes receiving a coil design; simulating position determination with the coil design to form a simulated performance; comparing the simulated response with the specification to provide a comparison; and modifying the coil design based on a comparison between the simulated performance and a performance specification to arrive at an updated coil design.

19 Claims, 24 Drawing Sheets

(56) References Cited

OTHER PUBLICATIONS

Palit, A.K., "Frequency Response Modeling of Inductive Position Sensor with Finite Element Tools," from the Proceedings of the 2014 COMSOL Conference in Cambridge (2014), pg. 1, col. 2, para 2-3; p. 3, col. 1, para 1-2; p. 4, col 1, para 1; p. 5, col. 1, para 1; p. 5, col. 2, para 1; Fig 1, 4, 8. Available Online at: https://www.comsol.com/paper/download/199331/palit_paper.pdf. pp. 1-4.

Aschenbrenner et al., "Contactless High Frequency Inductive Position Sensor with DSP Read Out Electronics Utilizing Band-Pass Sampling," ACTA IMEKO, 3(3) p. 50-56, Sep. 2014, abstract; p. 50, col. 2, para 1, 4: p. 51, col 2, para 1; Fig 2. Available Online at: https://actaimeko.org/index.php/acta-imeko/issue/view/8/showToc.

International Search Report issued by the International Searching Authority dated Nov. 9, 2018 for PCT Application No. PCT/US2018/041124. pp. 1-4.

Written Opinion issued by the International Searching Authority dated Nov. 9, 2018 for PCT Application No. PCT/US2018/041124. pp. 1-7.

\* cited by examiner

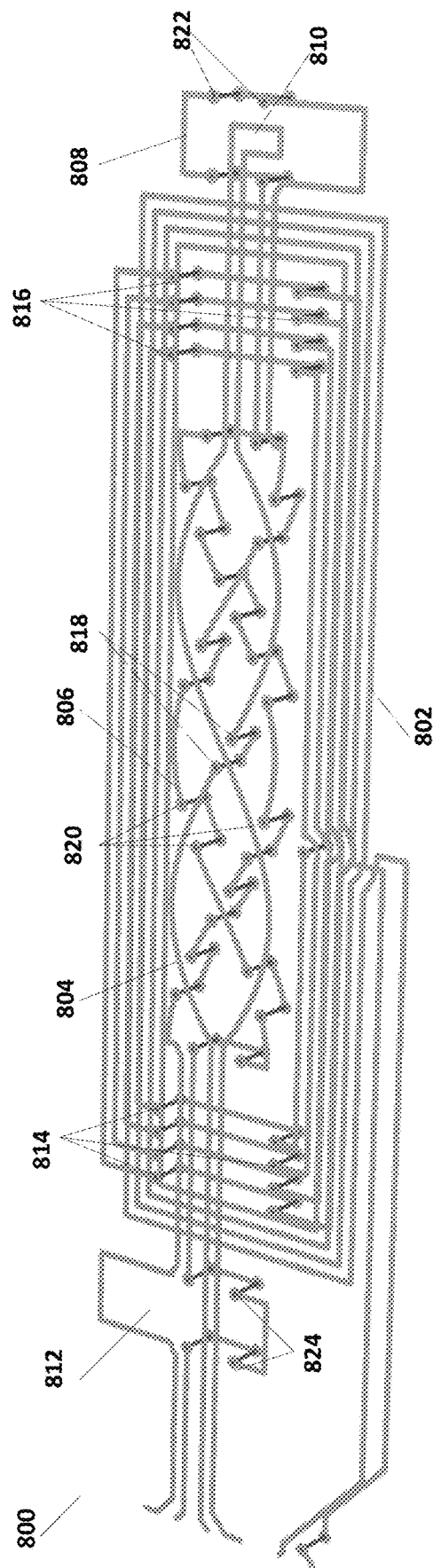
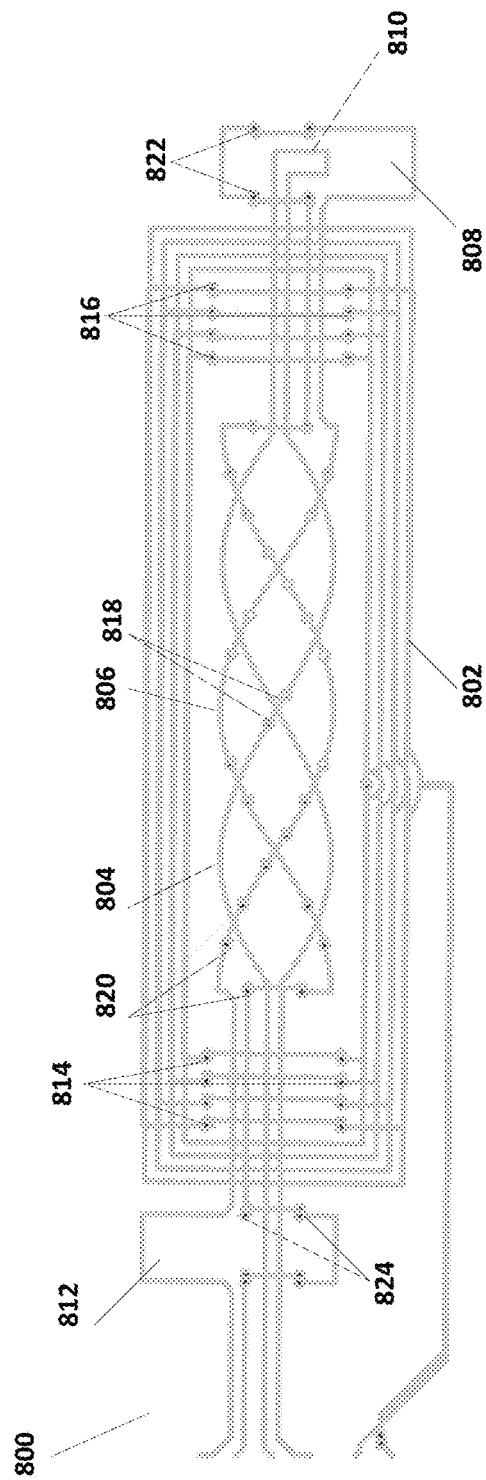
Figure 8A
Figure 8B

SENSOR COIL OPTIMIZATION

RELATED APPLICATIONS

This disclosure claims priority to U.S. Provisional Application 62/580,354 filed on Nov. 1, 2017, by inventors QAMA and SPECOGNA entitled "Sensor Coil Optimization," which is herein incorporated by reference in its entirety.

TECHNICAL FIELD

Embodiments of the present invention are related to position sensors and, in particular, to optimization of the sensor coils in a position sensor.

DISCUSSION OF RELATED ART

Position sensors are used in various settings for measuring the position of one component with respect to another. Inductive position sensors can be used in automotive, industrial and consumer applications for absolute rotary and linear motion sensing. In many inductive positioning sensing systems, a transmit coil is used to induce eddy currents in a metallic target that is sliding or rotating above a set of receiver coils. Receiver coils receive the magnetic field generated from eddy currents and the transmit coils and provide signals to a processor. The processor uses the signals from the receiver coils to determine the position of the metallic target above the set of coils. The processor, transmitter, and receiver coils may all be formed on a printed circuit board (PCB).

However, these systems exhibit inaccuracies for many reasons. For example, the electromagnetic field generated by the transmitter, and the resulting fields generated in the metallic target, may be non-uniform, the connections of wire traces to the transmit coils and the arrangement of receive coils may result in further non-uniformity. The air-gap (AG) between the metallic target and the coils mounted on the PCB may be non-uniform. Further, the amplitudes of signals generated by receiver coils may have an offset. There may be mismatches between the multiple receiver coils. There may be different coupling effects between the metallic target and each of the multiple receiver coils. These and other factors may result in inaccurate results of the position locating system.

Therefore, there is a need to develop better methods of designing sensor coils that offer better accuracy for position sensing.

SUMMARY

In some embodiments, a coil design system is provided. In particular, a method of providing an optimized position locating sensor coil design in presented. The method includes receiving a coil design; simulating position determination with the coil design to form a simulated performance; comparing the simulated response with the specification to provide a comparison; and modifying the coil design based on a comparison between the simulated performance and a performance specification to arrive at an updated coil design.

These and other embodiments are discussed below with respect to the following figures.

BRIEF DESCRIPTION OF THE FIGURES

FIGS. 8A and 8B illustrate a coil design according to some embodiments of the present invention

These and other aspects of embodiments of the present invention are further discussed below.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description illustrates inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Figure 1A:
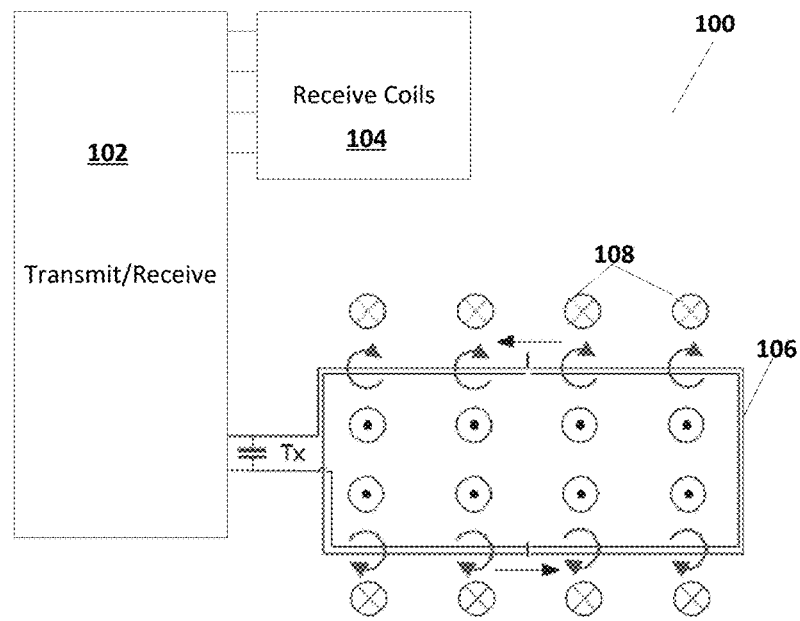
FIGS. 1A and 1B illustrates a coil system for determining a position of a target.

FIG. 1A illustrates a positioning system 100. As illustrated in FIG. 1A, the positioning system includes transmit/receive control circuit 102 that is coupled to drive a transmitter coil 106 and receive signals from receive coils 104. In most configurations, receive coils 104 are located within transmitter coil 106, however in FIG. 1A they are illustrated separately for clarification purposes. Receive coils 104 are generally physically located within the border of transmit coil 106.

Embodiments of the present invention can include a transmitter coil 106, two receiver coils 104, and an integrated circuit (IC) 102 driving the transmitter coil 106 and measuring the signals originated in the receiver coils 104 all formed on a printed circuit board (PCB).

Figure 1B:
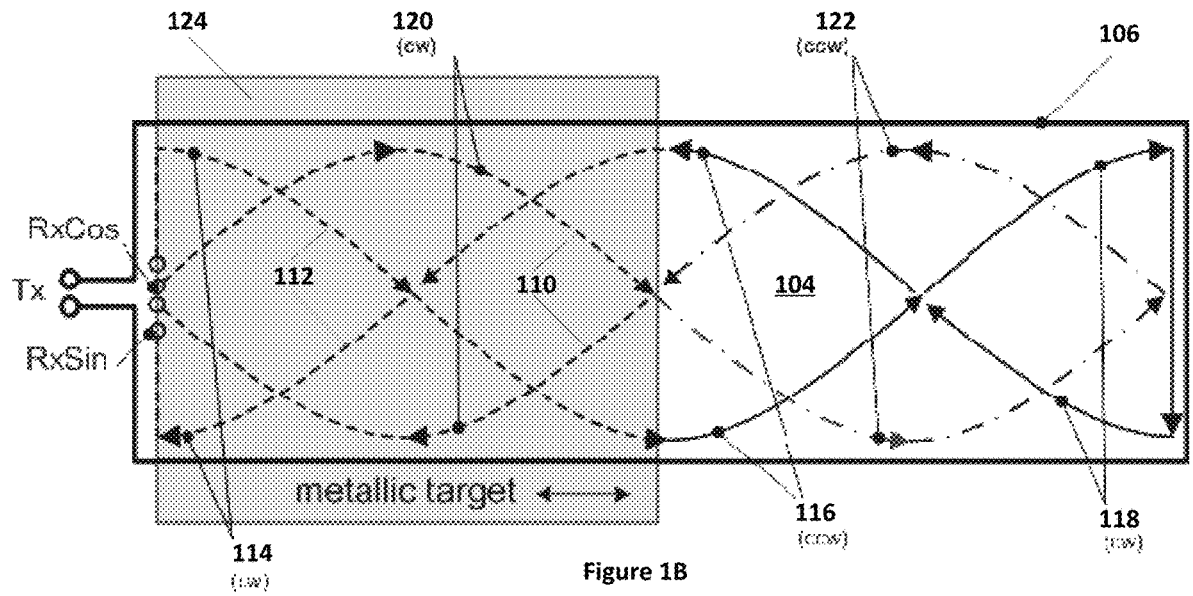

FIG. 1B illustrates a configuration of transmit coils 106 and receive coils 104 in a linear position locating system. As is shown in FIG. 1B, a conductive metallic target 124 can be positioned over the transmitter coil and the two receiver coils.

As is illustrated in FIG. 1A, transmit coil 106 is driven to form magnetic field 108. Transmit coil 106 can be driven at a range of frequencies or at particular frequencies. In FIG. 1A, magnetic field 108, with the positive current illustrated by the arrows, is circular around each wire and in a direction that points out of the page inside coil 106 and into the page outside of coil 108 with the current direction as illustrated in FIG. 1A. Receive coils 104 are located inside coil 106, as is illustrated in FIG. 1B. Transmit coil 106 is driven at any frequency that can produce electromagnetic field 108 to induce voltages in receiver coils 104. In general, there can be any number of receiver coils, however, for ease of discussion, a system with two receiver coils is discussed below.

FIG. 1B illustrates the arrangement of sensor receive coils (RX) 104 within transmit coil (TX) 106. As illustrated in FIG. 1B, sensor receive coils 104 includes a sine wave oriented coil RXSIN 112 and a cosine oriented signal coil RXCOS 110. Sine wave oriented coil RXSIN 112 includes sine loops 114, 116, and 118 where coil 112 is wound with in-phase or anti-phase directions, here depicted as clockwise or counter clockwise depictions, to result in the production of voltages in the loop of opposite sign as a result of the presence of electro-magnetic field 108. As is illustrated, the wiring of sine wave oriented coil 112 provides a clockwise rotation in loops 114 and 118 resulting in a nominally positive voltage and a counterclockwise rotation in loop 116 resulting in nominally negative voltages. Similarly, cosine oriented coil 110 may include a first loop 120 with a clockwise orientation and a second loop 122 with a counterclockwise orientation FIG. 1B illustrates a possible electromotive force reference direction, as indicated by the arrows, that is consistent with the magnetic fields produced by transmitter coil 106 as illustrated in FIG. 1A. As one skilled in the art will recognize, the orientations may be interpreted otherwise.

In the system illustrated in FIG. 1B, the transmitter coil (TX) 106 is stimulated by the circuit 102, which may be an integrated circuit, to generate a variable Electromagnetic field (EMF), illustrated as EMF field 108. The magnetic field 108 couples with the receiver coils (RX) 104. If a conductive metallic target 124 is placed on the top of the receiver coils 104 as illustrated in FIG. 1B, an eddy current is generated in the metallic target 124. This eddy current generates a new electromagnetic field that is ideally equal and opposite of field 108, canceling the field in receiver coils 104 directly under metallic target 124. The receiver coils (RX) 104 capture the variable EMF field 108 generated by the transmit coils 106 and those induced by metallic target 124, resulting in sinusoidal voltages generated at the terminals of receiver coils 104.

In absence of metallic target 124, there will be no voltage at the terminals of the RX coils 104 (labeled RxCOS 110 and RXSin 112 in FIG. 1B). When metallic target 124 is placed in a specific position with respect to the RX coils 104, the resultant electromagnetic field on the area covered by the metallic target 124 is ideally zero and therefore the voltages at the terminals of the RX coils 104 will have different characteristic depending on the location of metallic target 124 relative to receiver coils 104. The RX coils 104 are designed in a way that a sine voltage is created at the terminals of one RX coil (RxSin 112) and a cosine voltage is created at the terminals of the other RX coil (RxCos 110) as metallic target 124 is swept across receiver coils 104. The position of the target with respect to the RX coils 104 modulates the amplitude and the phase of the voltage at the terminals of the RX coils 104.

As illustrated in FIG. 1A and discussed above, transmitter coil 106, receive coils 104, and transmit/receive circuit 102 can be mounted on a single PCB. Further, the PCB can be positioned such that metallic target 124 is positioned above receive coils 104 and spaced from receive coils 104 by a particular spacing, the air gap (AG). The position of metallic target 124 relative to the PCB on which receive coils 104 and transmitter coil 106 is mounted can be determined by processing the signals generated by sine oriented coil 112 and cosine oriented coil 110. Below, the determination of the position of metallic target 124 with respect to receive coils 104 is described in a theoretical ideal condition.

In FIG. 1B, metallic target 124 is located at a first location. In this example, FIG. 1B and FIGS. 2A, 2B, and 2C depict operation of a linear position locator system. The principle of operation is the same in both linear and circular locators. In the discussion below, the position is given in relation to the construction of cosine oriented coil 110 and sine oriented coil 112 by providing the angular relations with respect to the sine operation of sine oriented coil 112 which results from the position of the leading edge of metallic target 124 and coils 110 and 112. The actual position of metallic target 124 in such a system can be derived from the angular position as measured by the output voltages of receive coils 104 and the topology of receive coils 110 and 112. Furthermore, as illustrated in FIG. 1B, the topology of coil 110 and the topology of coil 112 are coordinated to provide indication of the location of metallic target 124.

Figure 2A:
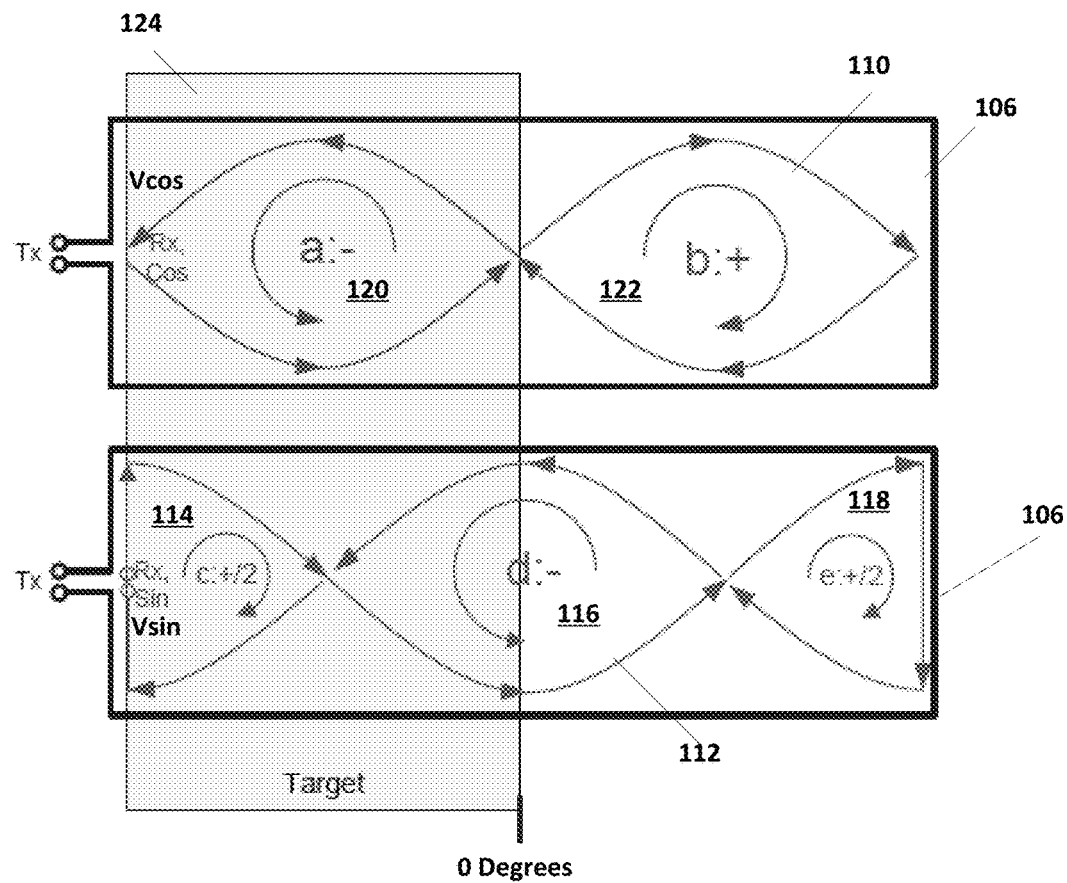
FIGS. 2A, 2B, 2C, 2D, and 2E illustrate response of the receiver coils while sweeping a metallic target across the coil system.

FIG. 2A illustrates the 0° position of metallic target 124 with cosine oriented coil 110 and sine oriented coil 112 separated for ease of explanation. As shown in FIG. 1B, sine oriented coil 112 and cosine oriented coil 110 are co-located within transmit coil 106. Using the magnetic field 108 as illustrated in FIG. 1A, loops 114, 116, and 118 of sine oriented coil 112 are positioned such that the sum of the voltages in each loop cancels so that the total $V_{sin}$ is 0. As illustrated in FIG. 2A, in the absence of metallic target 124, the voltage in loop 114, $V_c$ can be represented as ½, the voltage in loop 116 (because the current in that loop is opposite the current in loops 114 and 118) can be represented as $V_d$=−1, and the voltage in loop 118 can be represented as $V_e$=½. Consequently, the voltage in coil 112 is $V_{sin}=V_c+$ $V_d+V_e=0$. Consequently, if metallic target 124 is not present, then the output signal from sine oriented coil 112 would be 0.

Similarly, if metallic target 124 is not present, then the output signal from cosine oriented loop 110 is also 0 because the voltage generated by magnetic field 108 in loop 120, $V_a=-1$ cancels the voltage generated by magnetic field 108 in loop 122, $V_b=1$, so that $V_{cos}=V_a+V_b=0$. As discussed above, the voltage depictions provided here are proportional and depicted as a proportion of a full loop—loops 120, 122, and 116 can have a maximum representation of 1 while loops 114 and 118 can have a maximum representation of ½. The sign represents the reference direction of the loop, which results in generation of the voltage from that loop. The reference direction is arbitrary and consistent results can be calculated regardless of which of the two possible directions is chosen to depict positive.

However, with metallic target 124 placed at the 0° position, the magnetic field 108 in loop 114 of sine oriented coil 112 is canceled by eddy currents generated in metallic target 124 so that $V_c=0$. In loop 116 of sine oriented coil 112, the magnetic field 108 in the half of loop 116 under metallic target 124 is canceled by eddy currents formed in metallic target 124, but a voltage is generated by the magnetic field 108 in the half of loop 116 that does not lie under metallic target 124. Since half of loop 116 is exposed, the voltage generated is $V_d=-½$. Further, voltage is generated in loop 118 of sine oriented coil 112 such that $V_e$ is ½. However, the voltage generated by loop 116 is canceled by the voltage generated in loop 118, resulting in the voltage signal across sine oriented loop 112 is 0; $V_{sin}=V_c+V_d+V_e=0$.

In the same orientation of metallic target 124 with respect to cosine oriented coil 110, loop 120 is covered by metallic target 124 so that $V_a=0$. Loop 122 is exposed so that $V_b=1$. Therefore, the voltage across cosine oriented coil 110, $V_{cos}$, is given by $V_a+V_b=1$.

Figure 2B:
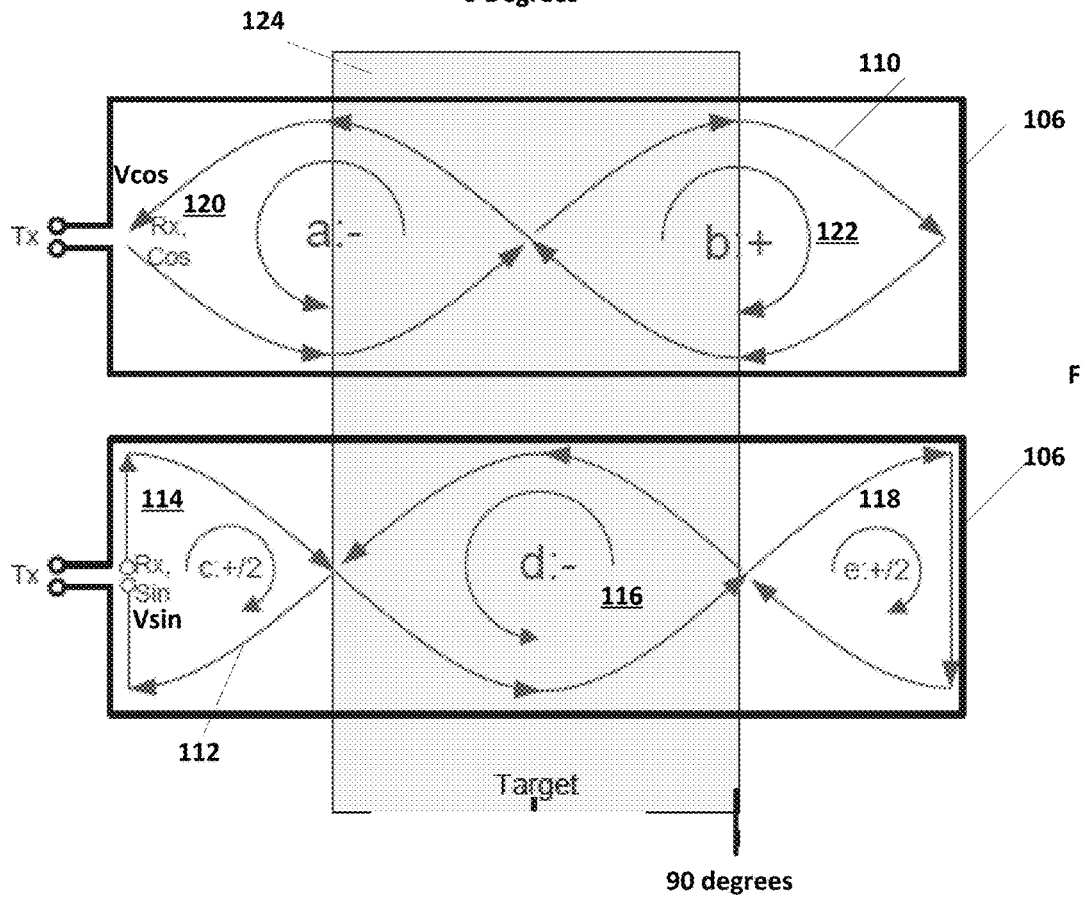

FIG. 2B illustrates metallic target 124 in a 90° position with respect to sine oriented coil 112 and cosine oriented coil 110. As illustrated in FIG. 2B, in sine oriented coil 112, metallic target 124 covers completely loop 116 and leaves loops 114 and 118 uncovered. As a consequence, $V_c=½$, $V_d=0$, and $V_e=½$ so that $V_{sin}=V_c+V_d+V_e=1$. Similarly, in cosine oriented coil 110, half of loop 120 is covered resulting in $V_a=-½$ and half of loop 122 is covered resulting in $V_b=½$. Consequently, $V_{cos}$, given by $V_a+V_b$, is 0.

Figure 2C:
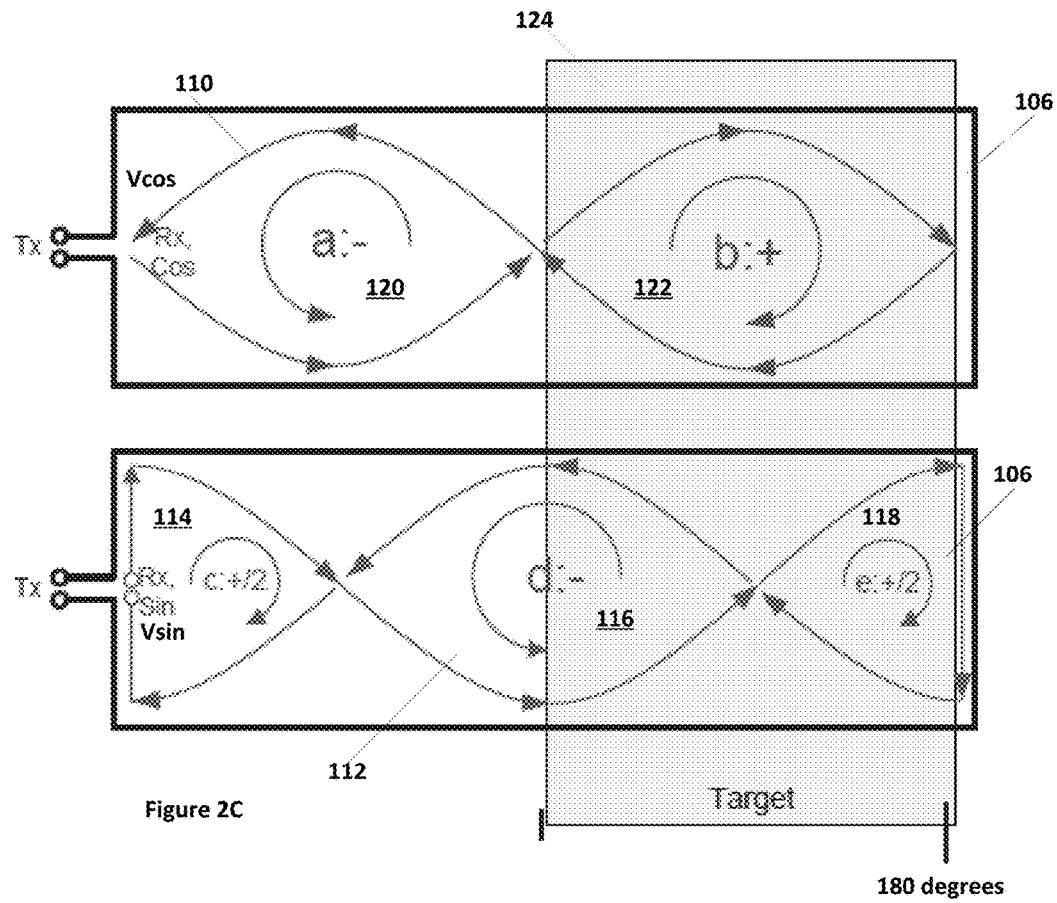

Similarly, FIG. 2C illustrates metallic target 124 in a 180° position with respect to sine oriented coil 112 and cosine oriented coil 110. Consequently, half of loop 116 and loop 118 in sine oriented coil 112 are covered by metallic target 124 and loop 122 in cosine oriented loop 110 is covered by metallic target 124. Therefore $V_a=-1$, $V_b=0$, $V_c=½$, $V_d=-½$, and $V_e=0$. As a result, $V_{sin}=0$ and $V_{cos}=-1$.

Figure 2D:
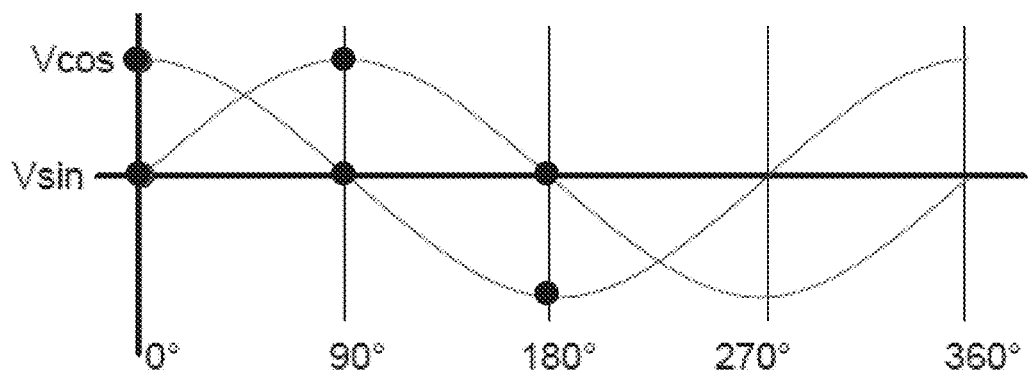

FIG. 2D illustrates a graph of $V_{cos}$ and $V_{sin}$ versus angular position of metallic target 124 with the coil topology provided in FIGS. 2A, 2B, and 2C. As is illustrated in FIG. 2D, the angular position can be determined by processing the values of $V_{cos}$ and $V_{sin}$. As illustrated by sweeping the target from a defined initial position to a defined end position, in the output of the receivers will be generated a sinusoidal (V sin) and cosinusoidal (V cos) voltage illustrated in FIG. 2D.

Figure 2E:
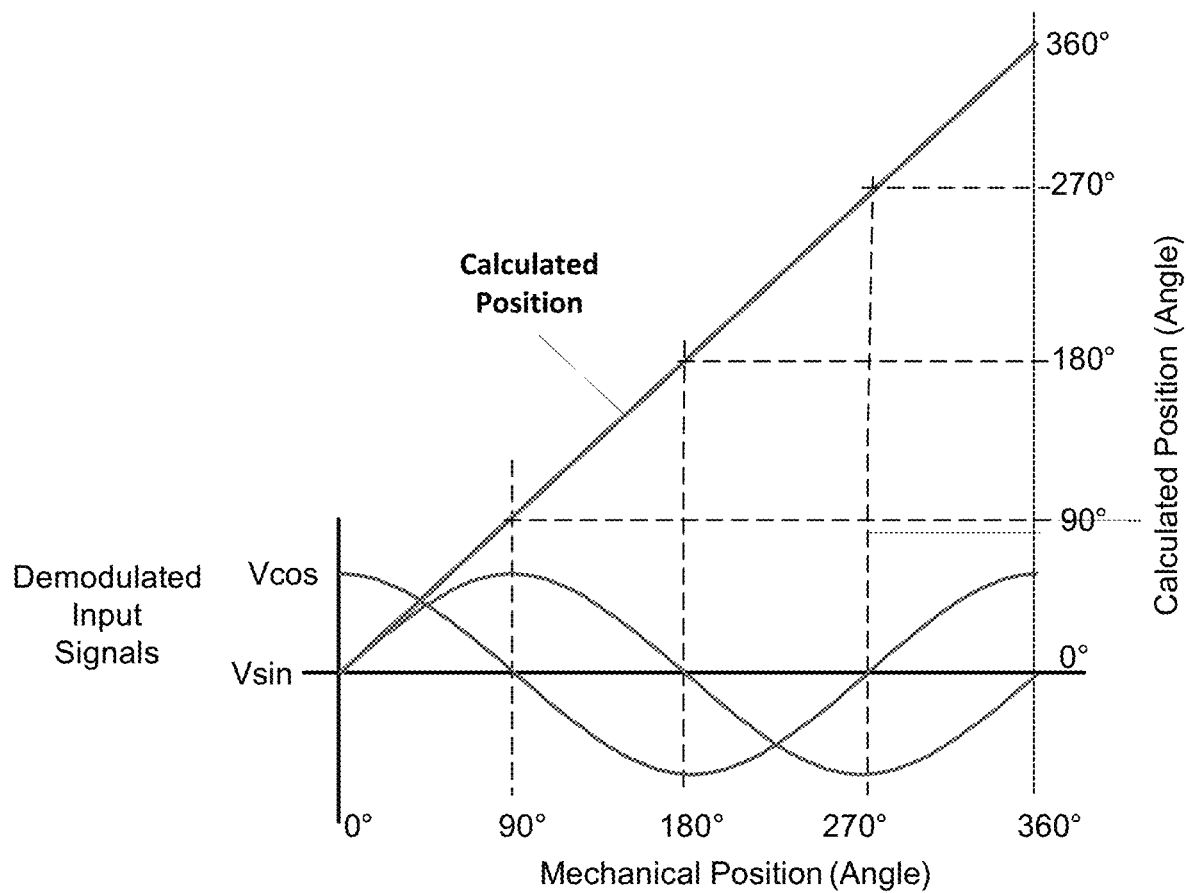

The angular position of metallic target 124 relative to receive coils 104 can be determined from the values of V sin from sine oriented coil 112 and V cos cosine oriented coil 110 as is illustrated in FIG. 2E. For example, the angular position of the target can be calculated as Angular position=arctan($V$ sin/$V$ cos).

FIG. 2E illustrates this and shows the sinusoidal forms of $V_{cos}$ and $V_{sin}$ along with the determination of the position of metallic target 124 derived from the values of $V_{cos}$ and $V_{sin}$. In a linear position locating system, the linear position can be determined by the angular position through knowledge of the wavelength of the sinusoidal forms of the traces of receiver coils 104 (i.e., the separation between peak separation areas of the traces of the sine oriented coil 112 and the cosine oriented coil 110). In an angular position locating system, the sine oriented coil 112 and cosine oriented coil 110 can be arranged such that the angular position can be equal to the actual angular position of the metallic target 124 with respect to the rotation of metallic target 124.

It is important to note the following conditions that indicate an ideal operation of position location sensor 100. Among those conditions are that the shape of transmitter coil 106 has no importance as long as it covers the area where the receiver coils 104 are placed. Further, the shape of the receiver coils 104 is equal to a perfect geometrical overlapped sine and cosine. Additionally, the shape of metallic target 124 has no influence on the working principle as long as the area of the target covers a part of the total area of the receiver coils 104.

These conditions for an ideal set of coils and ideal metallic target are never met. In a real system, the situation is very different. The non-ideality leads to inaccuracy in the determination of the position of metallic target 124. Among the issues that result in inaccuracies in location determination include non-uniformity of the electromagnetic field generated in transmit coil 106; connections of metallic traces between transmit/receive circuit 102 and receive coils 104 and connections of metallic traces between transmit/receive circuit 102 and transmit coil 106, which also contribute to the generated electromagnetic fields; the air gap (AG) between metallic target 124 and the PCB on which receive coils 104 and transmit coil 106 is mounted; amplitude offsets between sine oriented coils 112 and cosine oriented coils 110; mismatches between signals from receive sine oriented coils 112 and cosine oriented coils 110; different coupling effects in sine oriented coils 112 and cosine oriented coils 110. Further, there is a strong correlation between the air gap (AG) between the metallic target 124 and the PCB and the accuracy of the location determination. Furthermore, in the ideal world, the topology of sine oriented coil 112 and cosine oriented coil 110 are ideal trigonometric functions but in an actual design these coils 104 are not ideal and have several through vias to allow traces to be intertwined on the PCB by using both sides of the PCB.

Figure 3A:
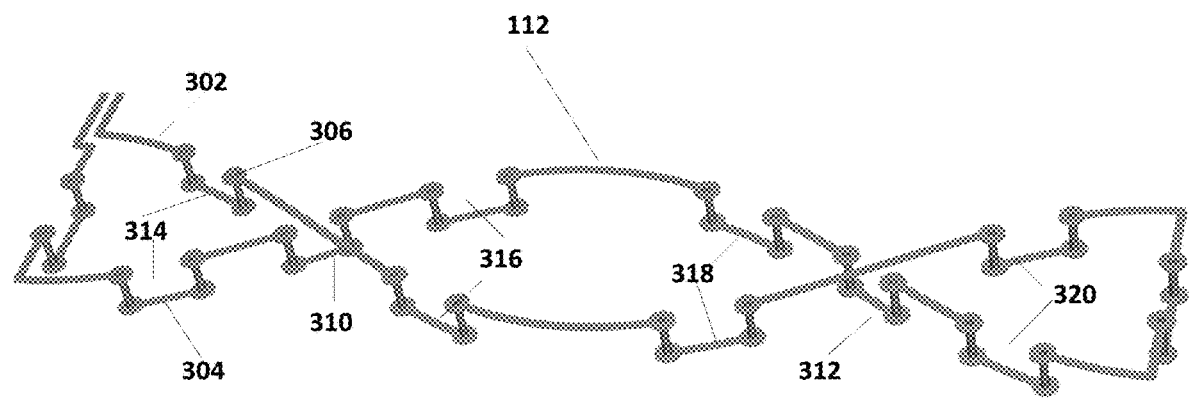
FIGS. 3A and 3B illustrate configuration of receive coils on a printed circuit board in a coil system.
Figure 3B:
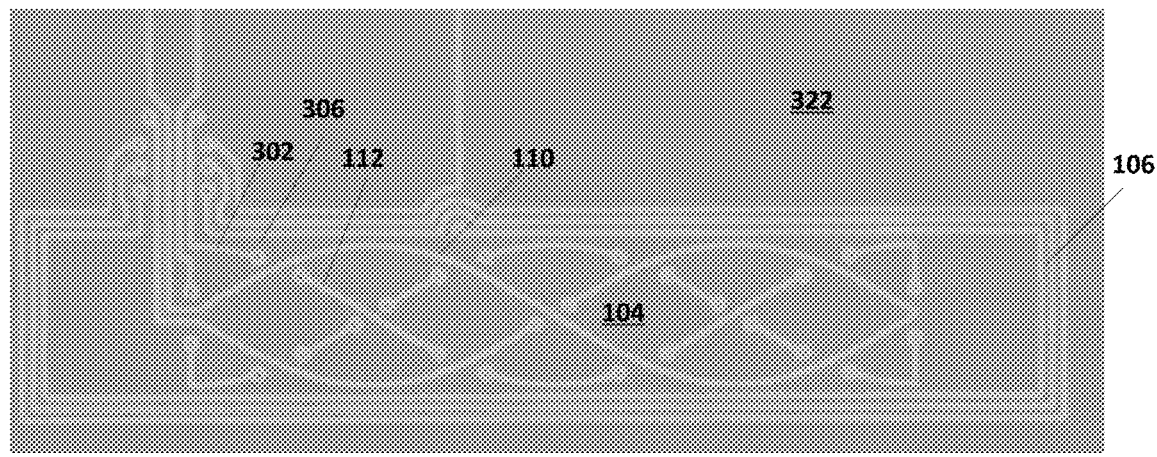

FIG. 3A illustrates a sine oriented coil 112 oriented on a PCB (not shown in FIG. 3A for clarity). The PCB is positioned such that traces that form sine oriented coil 112 are positioned on a top side and a bottom side of the PCB. In this disclosure, references to the top side or the bottom side of the PCB indicated opposite side of the PCB and have no other meaning regarding the orientation of the PCB. In general, the position locating system is oriented such that the top side of the PCB faces a surface of metallic target 124. FIG. 3B illustrates a top side of PCB 322 on which top side traces for formation of transmit coil 106, sine oriented receiver coil 112, and cosine oriented receiver coil 110 are formed.

As is illustrated in FIG. 3A, coil 112 is formed by traces 302 on the top side of the PCB 322 and traces 304 on the bottom side of the PCB 322. Traces 302 and 304 are electrically joined by vias 306 formed through the PCB 322. As is illustrated in FIG. 3A, vias 306, top side traces 302, and bottom side traces 304 are arranged to allow formation of cosine oriented coil 112. For example, portions 310 and 312 allow for crossing of coil 112 to form loops 114, 116, and 118 while separated the traces at the intersection. As is further illustrated, portions 314, 316, 318, and 320 allow for overlay of cosine oriented coil 112 on the PCB.

However, vias 306 and the existence of traces 302 and 304 on opposite sides of PCB 322 decrease the effective amplitude of the signal detected by coils 104. Effectively, vias 306 make the gap distance between transmit coil 106 and signal coils 104, which has a large influence in itself on accuracy of the position locating system. This is combined with the increase in the effective air gap between metallic target 124 and signal coils 104 on the PCB 322 due to traces of signal coils 104 being formed both on the top side and the bottom side of PCB 322.

FIG. 3B illustrates a further problem with symmetries where transmit coil 106 is not symmetric with receive coils 104. In the case shown in FIG. 3B, receive coils 104 are not centered on the transmit coils 106 and the traces that form connections to receive coils 104 and to transmit coil 106 are also not symmetric.

Figure 3C:
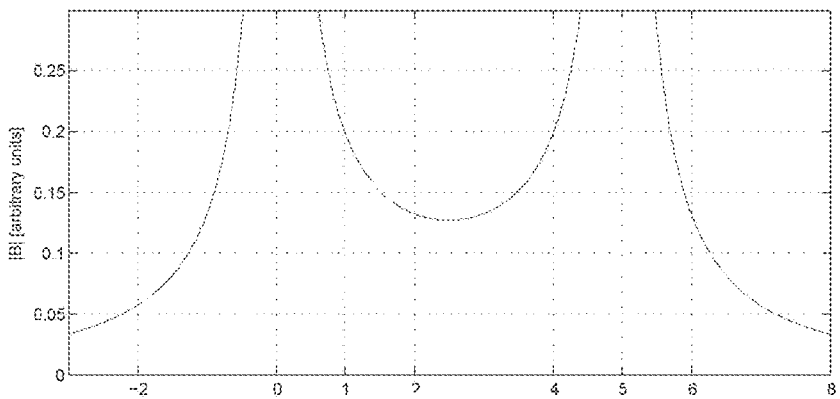
FIG. 3C illustrates inhomogeneity of electromagnetic fields generated by a transmit coil in the coil system.

FIG. 3C illustrates the non-uniformity of the magnetic field strength generated by transmit coils 106. As is illustrated in FIG. 3C, two traces of transmit coil 106 are located at positions 0 and 5 on the graph while receive coils 104 are positioned between positions 0 and 5. FIG. 3C illustrates the magnetic field between these traces has a minimum between the two traces. FIG. 3C does not illustrate the further distortion because of the two traces that connect the two traces illustrated in FIG. 3C and run perpendicular to the traces illustrated in FIG. 3C.

Figure 3D:
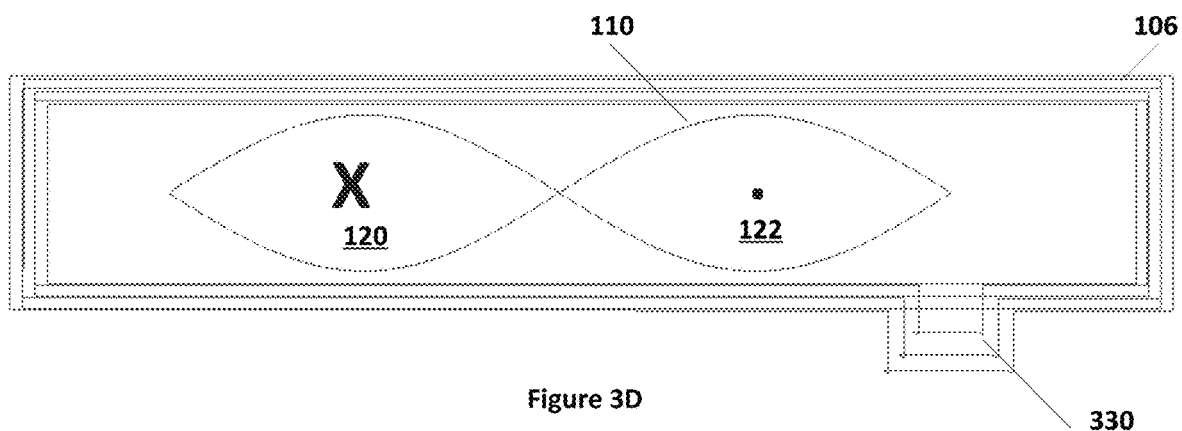
FIGS. 3D and 3E illustrate discrepancies in fields measured by receiver coils in a coil system.
Figure 3E:
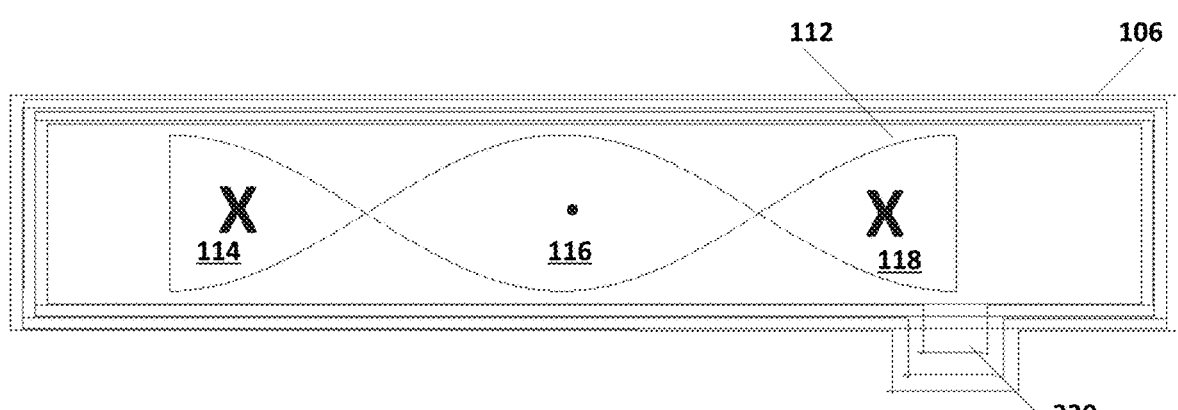

FIG. 3D and FIG. 3E further illustrates inaccuracies that can result from displacements in transmit coil 106. As illustrated in FIGS. 3D and 3E, transmit coil 106 includes a displacement 330 that distorts the magnetic field produced by transmit coil 106. Stray fields from displacement 330 produce imbalances in the receive coils 104. Consequently, inaccuracies in position determination will develop from such features.

Figure 4A:
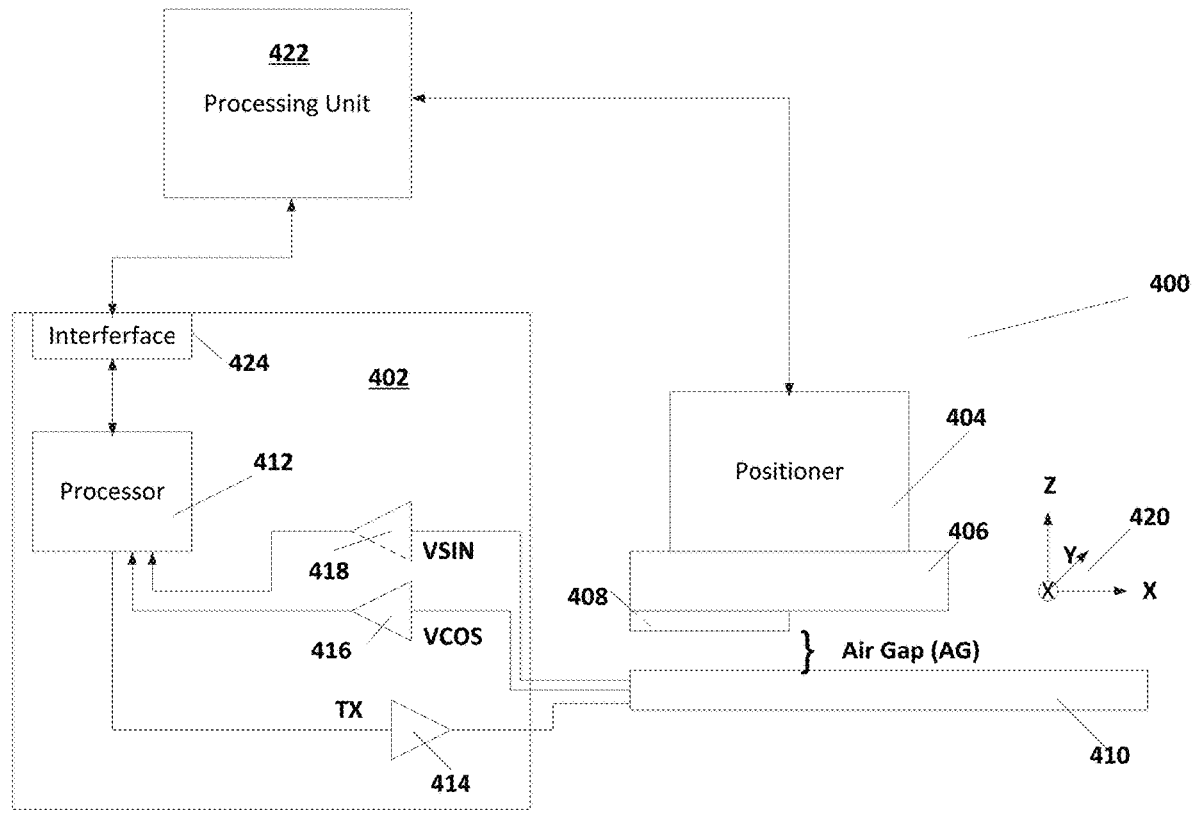
FIG. 4A illustrates a block diagram of a testing device that tests the accuracy of a position locate system.
Figure 4B:
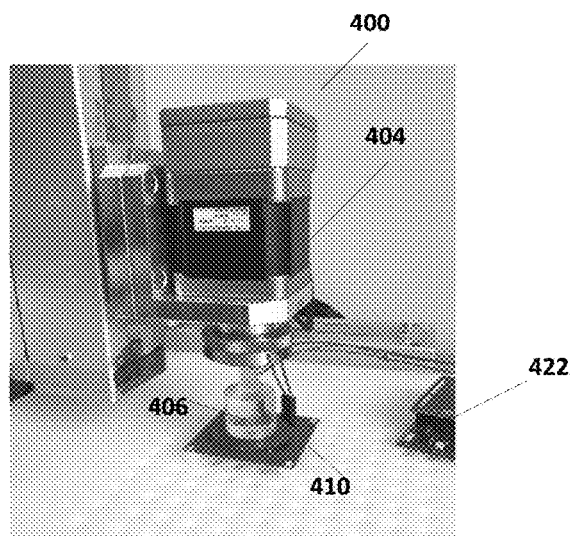
FIG. 4B illustrates a test device such as that illustrated in FIG. 4A.

FIGS. 4A and 4B illustrate a calibration and test device 400 that can be used to evaluate position locating systems. Due to non-idealities of the magnetic coupling principle such as those described above, a calibration procedure can be used to correct the measured position of the target with respect to the positioning device. Furthermore, system 400 can be used to test the accuracy of positioning systems such as those described above.

FIG. 4A illustrates a block diagram of an example system 400. As is illustrated in FIG. 4A, a metallic target 408 is mounted on a platform 406 such that is over a position locating system 410. A positioner 404 is capable of moving platform 406 relative to position locating system 410 in a precise manner. As discussed above, position locating system 410 includes transmit coils and receive coils formed on a PCB and may include a controller 402 that receives and processes signals from the receive coils and drives the transmit coil.

As is further shown in FIG. 4A, metallic target 408 is positioning in a z-direction to provide an air gap (AG) between metallic target 408 and position locating system 410. In some embodiments, positioner 404 is capable of moving metallic target 408 linearly in an x-y plane as illustrated in coordinate system 420. In some embodiments, positioner 404 rotates metallic target 408 around a center-of-rotation over position locator system 410 as needed, for example, for testing a rotation locator rather than a linear locator.

Controller 402 is coupled to provide control signals and receive the receive coil signals from positioner 404. Controller 402 is further coupled to provide transmit power to transmit coils on locating system 410 and to receive and process signals from receive coils in locating system 410. As illustrated above, position locating system 410 may include a transmit coil 106, cosine oriented coil 110, and sine oriented coil 112 as discussed above. In some cases, controller 402 may be mounted on the same PCB with transmit coil 106, cosine oriented coil 110, and sine oriented coil 112 of locating system 410 and provide locate signals to a separate processor 422.

Processor 422 can be any processing system capable of interfacing to controller 402 and to positioner 404. As such, processor 422 may include one or more microcomputers, transient and nontransient memory, and interfaces. Processor 404 communicates with positioner to determine the precise location of metallic target 408 with respect to position locating system 410 and to provide signals to positioner 404 that determine the sweep of metallic target 408 over the receive coils mounted in position locating system 410. As such, processing unit 422 can compare the measured position of metallic target 408 as determined by controller 402 with the determined position as provided by positioner 404 to evaluate the accuracy of position locating system 410. In some embodiments, controller 402 may be combined with processing unit 422, which performs all of the tasks for determining the actual position of metallic target 408 from positioner 404 and the measured position of metallic target 408 from coils on position locating system 410 and determining the accuracy of the measured position from position locating system 410.

As is further illustrated in FIG. 4A, controller 402 can include a processor 412 (which may a processor in processor 422) that drives the transmit coils through driver 414 and receives signals from the receive coils as well as processes the data from the receive coils in order to determine the location of metallic target 508 relative to the receive coils. Processor 412 can, through interface 424, communicate with devices such as processing unit 422. Further, processor 412 drives a transmit coil such as transmit coil 106 through a driver 404. Driver 404 may include circuitry such as digital-to-analog converters and amplifiers to provide current to transmit coils such as transmit coil 106. Additionally, processor 412 can receive the receive signals V sin and V cos from receive coils such as coils 110 and 112. The signals V sin and V cos from the receive coils is received into buffers 416 and 418, which may include circuitry such as filters and amplifiers as well as analog-to-digital converters to provide digital data to processor 412. Processor 412 can calculate a position as described above to provide positional data of metallic target 408 with respect to the receive coils on position locating system 410.

FIG. 4B illustrates an example of positioning system 400. Positioner 404 is coupled to a mount 406 and can include four stepper motors that provide a 4-axis movement of the target—x, y, z and rotational around the z axis. As such, system 400 as illustrated in FIG. 4B is able to sweep the metallic target 408 on the top of the receiver coils in position locator system 410 in all possible directions, including the z direction to create different air gaps. As discussed before, the air gap is the distance between the metallic target 408 and the PCB where the transmit and receive coils of position locate system 410 are placed. Such a system can be used for calibration, linearization, and analyzing the accuracy of position locator system 410.

Figure 4C:
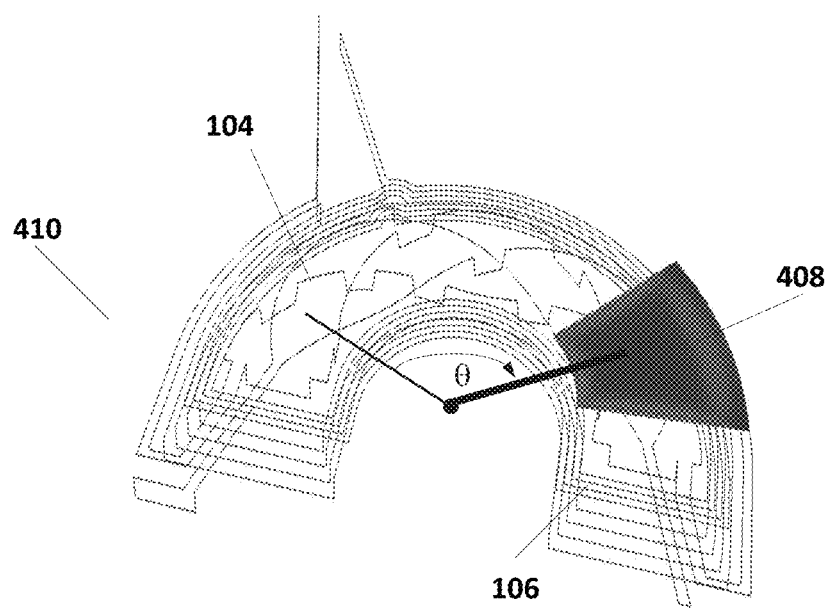
FIG. 4C illustrates testing a position locating system with the test device illustrated in FIG. 4B.
Figure 4D:
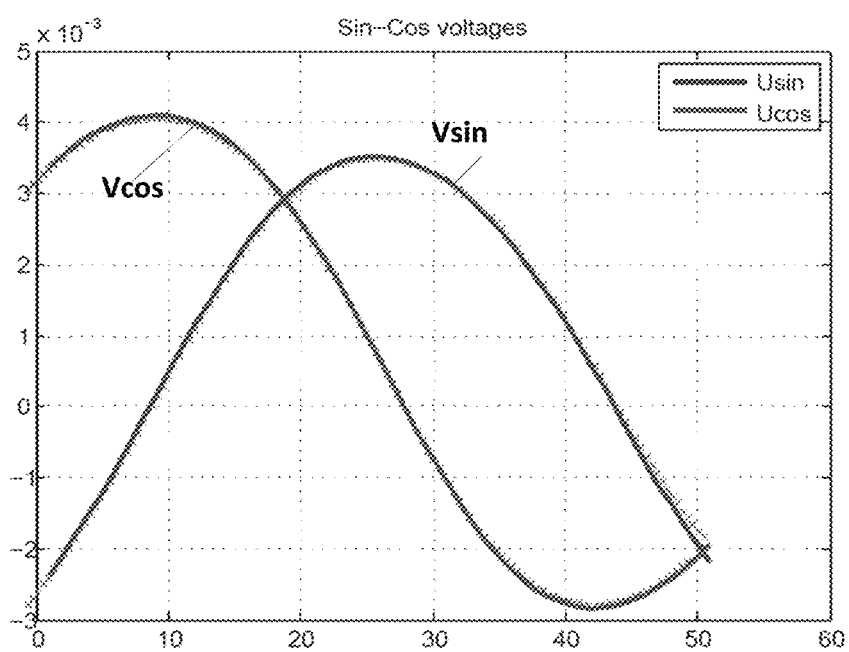
FIG. 4D illustrates received voltages from receive coils in the position locating system measured with the test device illustrated in FIG. 4B.

FIG. 4C illustrates a sweep of a metallic target 408 over a rotation position locator system 410 with transmit coils 106 and receive coils 104. As is illustrated in FIG. 4C, metallic target 408 is swept from 0° to θ° over receiver coils 104. FIG. 4D illustrates an example of the voltages V sin and V cos measured from receiver coils 104 compared with the results of the simulation as metallic target 408 is swept as illustrated in FIG. 4C. In the particular example of FIG. 4D, metallic target 408 is swept in 50 positions. The crosses represent the sample voltages and the continuous lines represents values simulated by an electromagnetic field solver program, CDICE-BIM.

Figure 5:
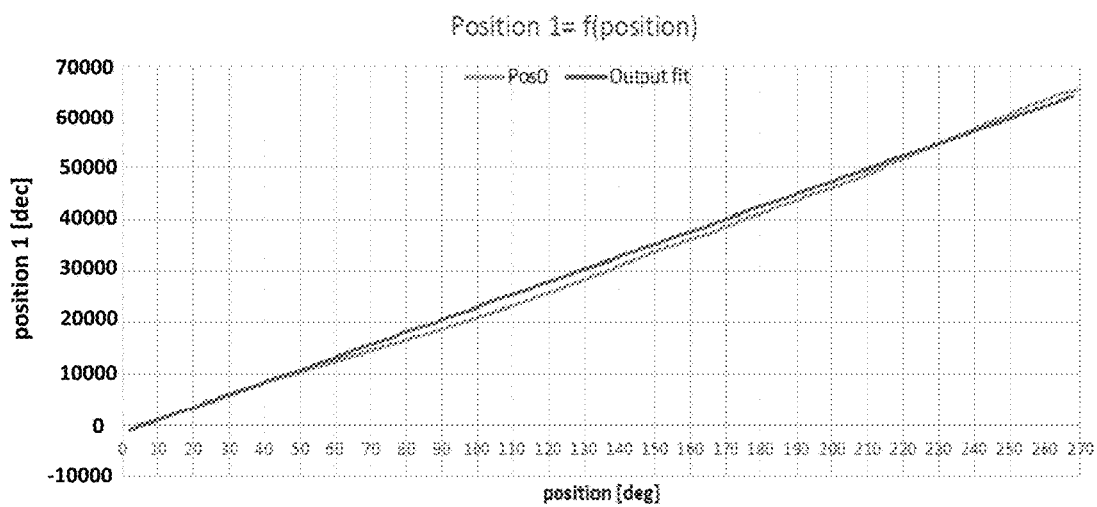
FIG. 5 illustrates a measured response and a simulated response.

The accuracy of position locator system 410 can be defined as the difference between the measurement of the position during a sweep of the metallic target 408 from an initial position to an end position and an expected ideal curve for that sweep. This result is expressed in percentage respect to the full scale, as is illustrated in FIG. 5. In FIG. 5, Pos0 is the measured value from position locating system 410 and the output-fit is the ideal curve.

$$FNL = \frac{100(Pos0 - Ideal_{curve})}{Fs}$$

Figure 6:
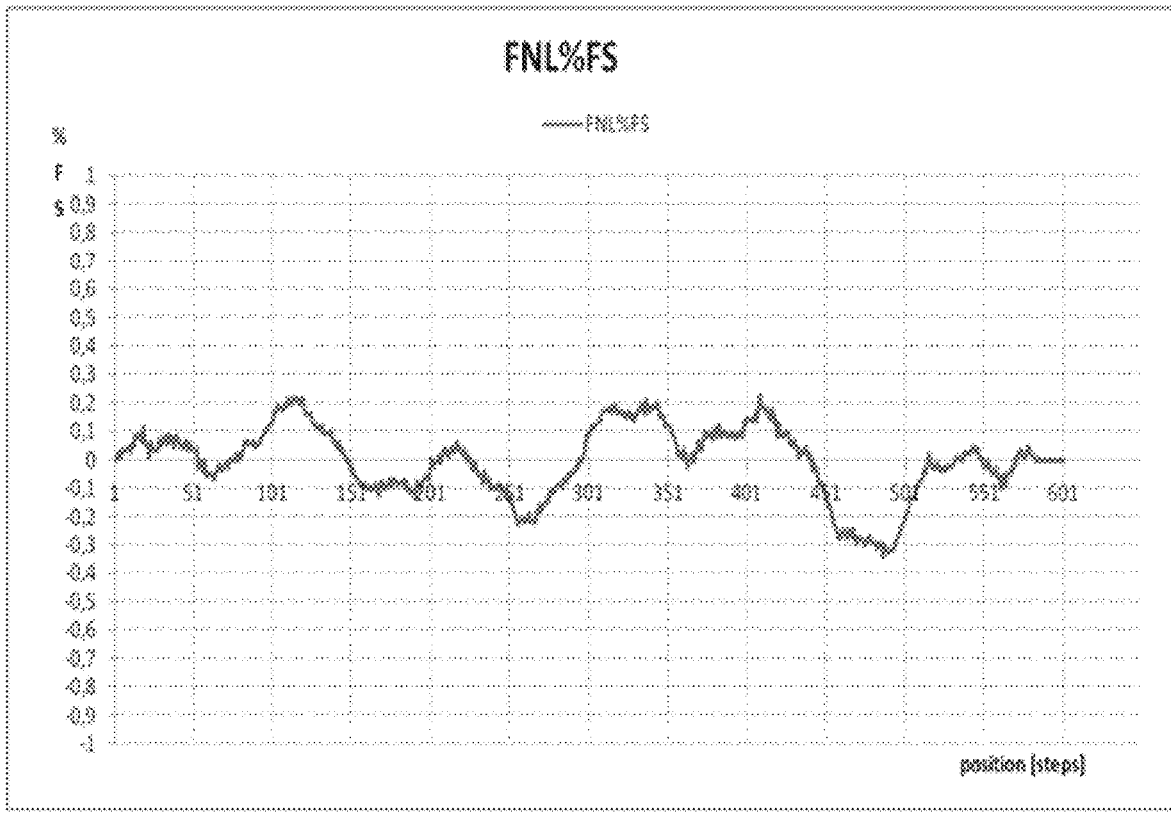
FIG. 6 illustrates an error between the measured and simulated responses of an example coil design optimized according to embodiments of the present invention.

Pos0 is the value measured from a register of controller 402 while FS is the value at full scale. For example, with a 16 bit register FS is 2E16−1=65535. FIG. 6 illustrates the error in terms of FNL % FS as determined by the above equation. The goal is to produce position sensing with the best possible accuracy, for example of 0.2% FS or less.

If the coil design on a PCB is designed using a trial and error method, the best achieved accuracy is 2.5% FS-3% FS. In a sensor formed on a PCB there are two receiver coils and one transmitter coil. The accuracy of the position measured is extremely relevant to the coil design. Trial and error coil design on PCB have empirically attempted to resolves these issues. However, such a simplified and inaccurate method can only take into account a limited set of the issues. All these procedures do not lead to a successful design because the whole system, coil—target—traces, is more complex than can be easily accounted for and the optimal solution has to take into account a more substantial number of the parameters if the resulting coil design will meet desired accuracy specifications.

Figure 7A:
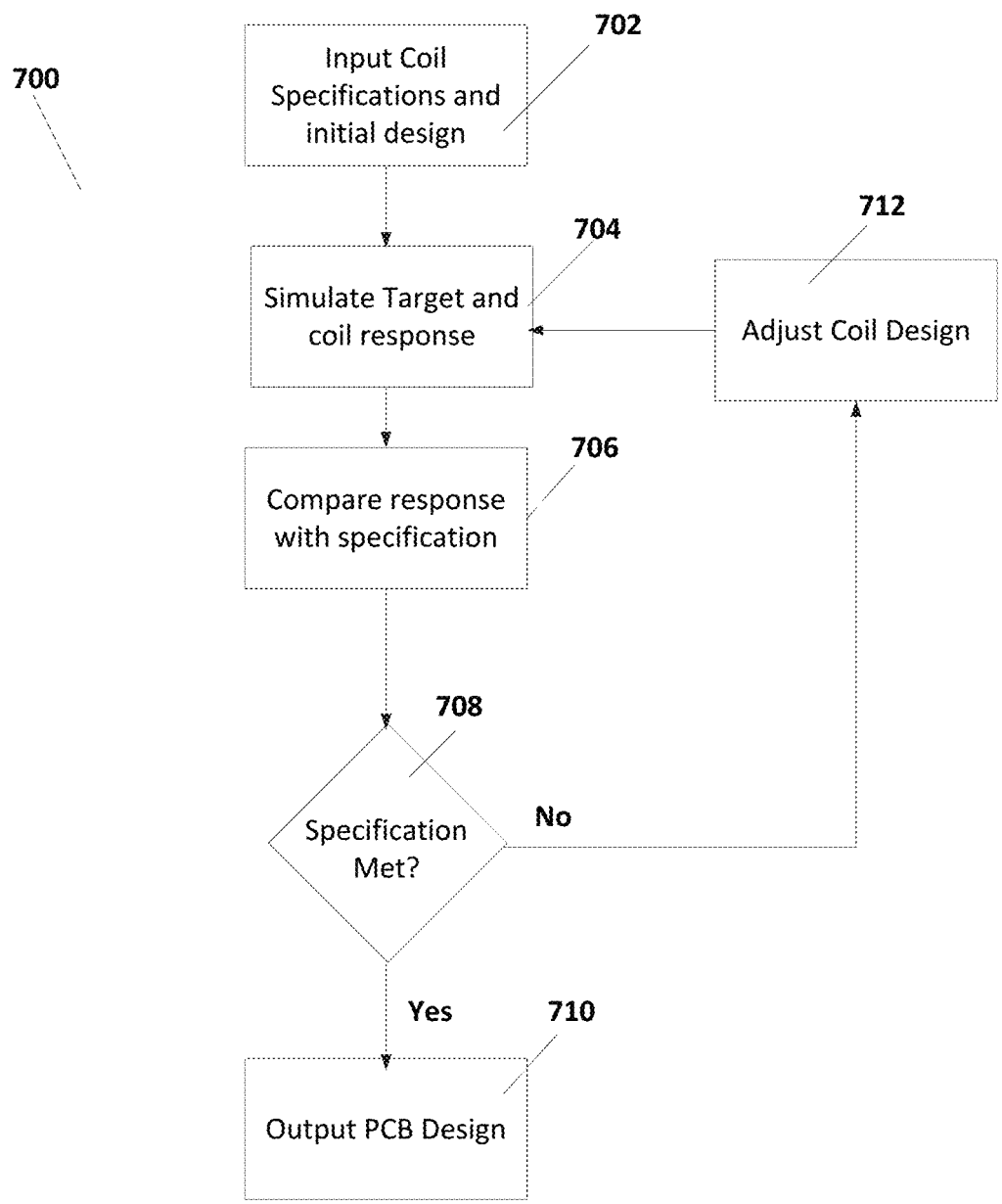
FIGS. 7A and 7B illustrate an algorithm for optimizing coil design for a position location sensor according to some embodiments of the present invention.

FIG. 7A illustrates an algorithm 700 for providing a coil design on a printed circuit board for an accurate position locating system according to some embodiments of the present invention. Algorithm 700 can be executed on a computing system with sufficient computing power to execute the appropriate simulations. Such a system would typically include a processor coupled to memory. The memory may include both volatile and non-volatile memory for storage of data and programming. In some cases, fixed storage such as hard drives and such can be utilized. The system would include user interfaces such as keyboards, touchscreens, video displays, pointing devices, or other common components. The system would be capable of executing the algorithms described here, interacting with a user, and outputting a finalized coil design for production of a printed circuit board with the optimized design.

Figure 7B:
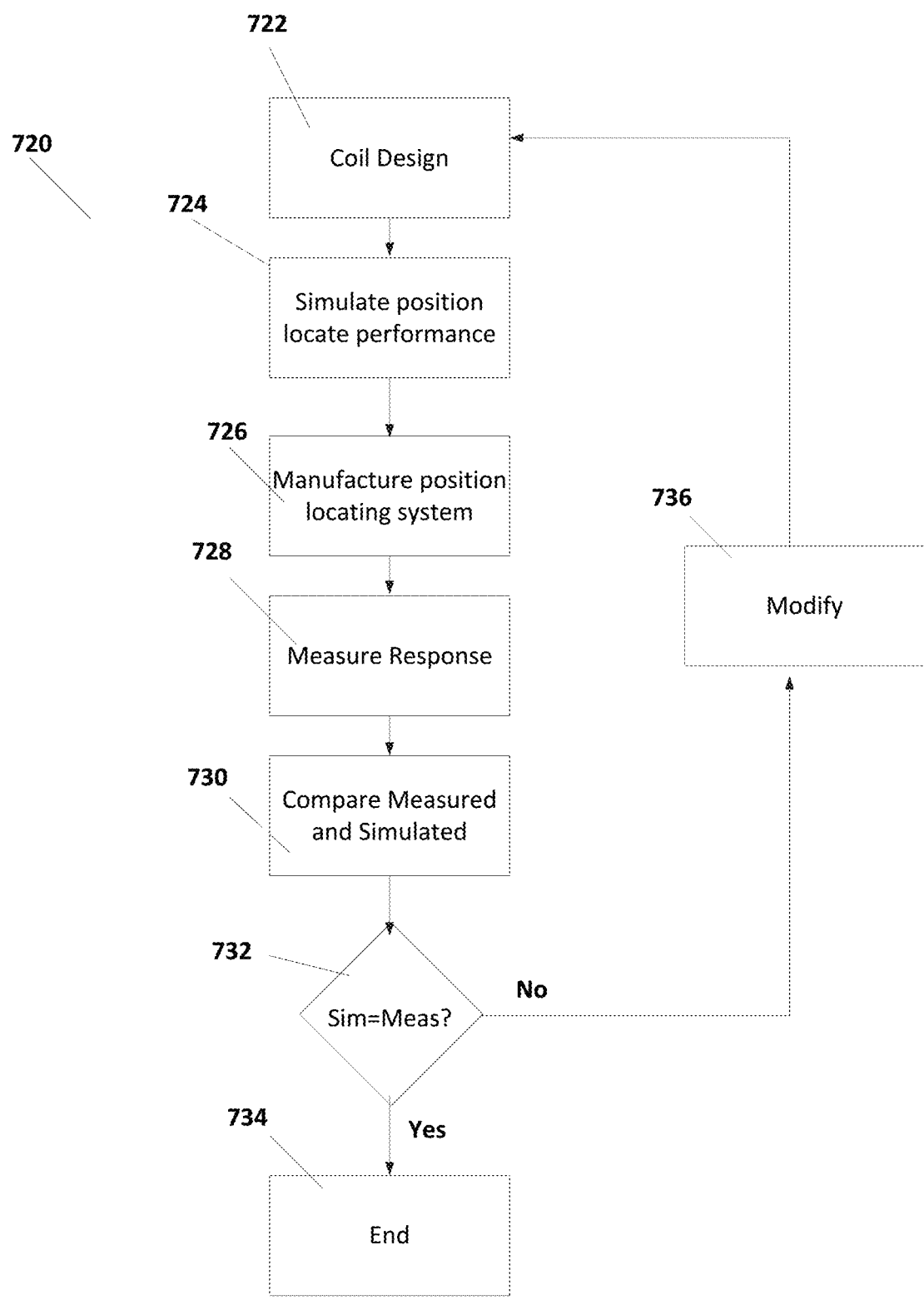
Figure 7C:
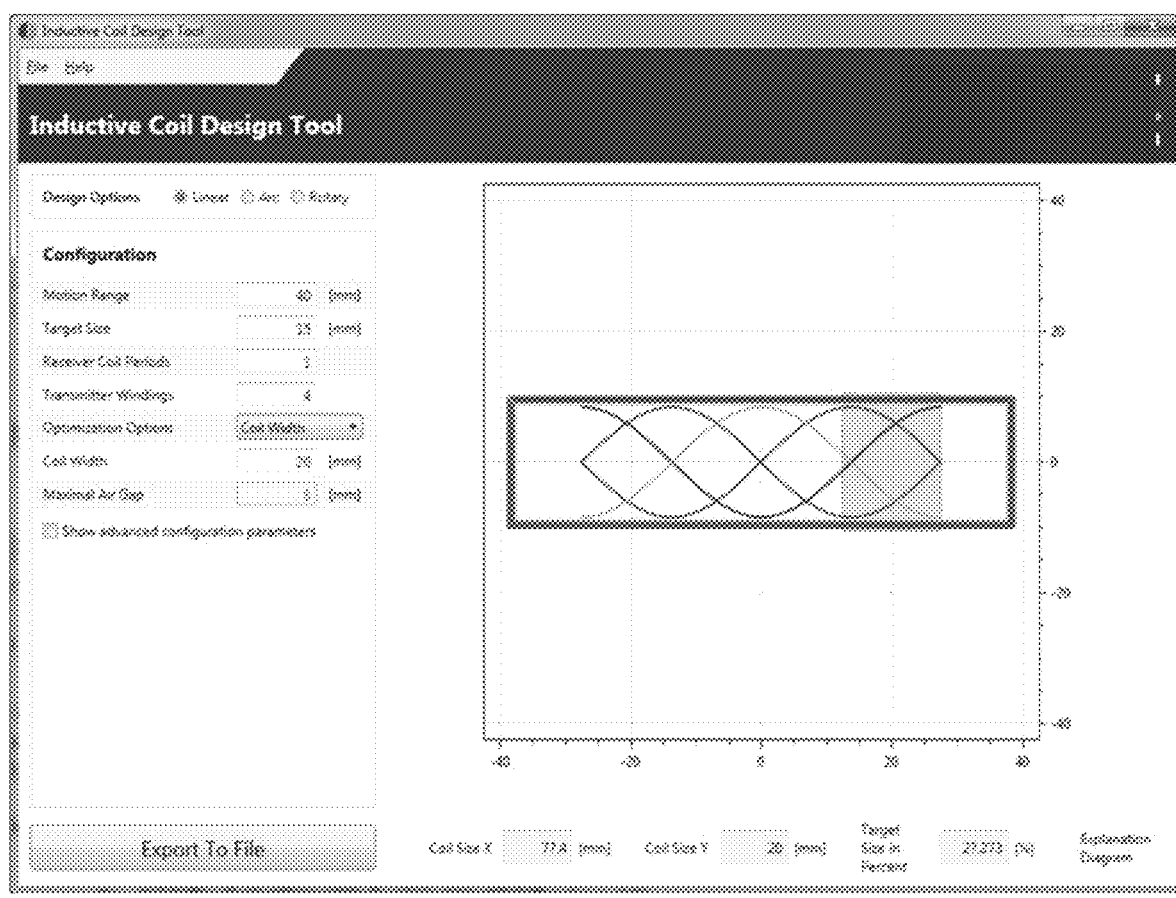
FIG. 7C illustrates an input screen shot for a system operating the algorithm illustrated in FIG. 7A.

As illustrated in FIG. 7A, algorithm 700 starts with an input step 702. In step 702, a first coil design is input for optimization. In particular, the coordinates, layout, and characteristics of the transmit coil and the receive coils are entered, including information regarding connection nodes, vias, and other parameters regarding these coils. Additionally, the design of the metallic target, including the air gap distance between the metallic target and the coils, is input. Further, the desired specification for the accuracy of the position location system that results is provided. System operating parameters (e.g., the frequency and strength at which transmit coils are expected to be driven) are also input. Once the data is input to algorithm 700 in step 702, algorithm 700 continues to step 704. FIG. 7C illustrates a screen-shot indicating input of coil design parameters of step 702.

In step 704, the response to the input of power to the transmit coil with the metallic target at various position through its sweep is simulated. In particular, the fields generated by the metallic target in response to the fields generated by the transmit coil is determined. From those fields, the response of the receive coils for the current coil design is simulated. From the receive coil response, a position of the metallic target calculated from the receive coil response is compared with the position of the metallic target as set during the simulation.

In step 706, the simulated position is compared to the set position position of the metallic target. In step 708, if the specification is met, algorithm 700 proceeds to step 710 where the final optimized coil design is output. In step 708, if the specification is not met algorithm 700 proceeds to step 712.

In step 712, the design of the coils on the PCB are adjusted in accordance with simulated results from step 704 and the comparison in step 706 in order to improve the accuracy of the finally designed coil design. In some embodiment, the transmitter coil design remains fixed as input into step 702 and the receiver coil design and layout are adjusted to improve accuracy. In some embodiments, the transmitter coil may also be adjusted to improve accuracy.

Algorithm 700 shown in FIG. 7A results in a coil design for printing on a printed circuit board with a simulated accuracy as specified during the specification input that occurred in step 702. FIG. 7B illustrates an algorithm 720 for verifying a coil design, which may be the coil design produced by algorithm 700 in FIG. 7A.

As shown in FIG. 7B, a coil design is input in step 722. The coil design may be an older legacy design, may be a new design, or may have been produced by algorithm 700 as illustrated in FIG. 7A. In step 724, a simulation is performed on the coil design. In some cases, where the coil design input is produced by algorithm 700, this simulation has already been performed in step 704 of algorithm 700. Otherwise, a similar simulation is performed. In step 726, the coil design is physically produced on a printed circuit board. In step 728, the physically produced coil design response is measured, for example with positioning system 400 as illustrated in FIGS. 4A and 4B.

In step 730, the measured results from the physically produced coil design are compared with the simulated results from the coil design. Step 730 may, then, validate the simulation performed in step 724 with respect to its accuracy. In step 732, if the simulation matches the measured results, then algorithm 720 proceeds to step 734 where the coil design has been validated. In step 732, if the simulated results do not match the physically measured results, then algorithm 720 proceeds to step 736.

In step 736, if algorithm 720 is being performed as a validation of a coil design produced by algorithm 700, the input design to algorithm 700 is modified and algorithm 700 rerun. In some embodiments, in step 736 an error is produced indicating that the simulation is not operating properly and therefore the simulation itself need adjusting in order to better simulate all of the non-idealities in the particular position locating system. In that case, step 736 can also be a model calibration algorithm.

Consequently, in some embodiments of the present invention, an optimized coil design can be produced by iteratively providing a simulation of the current coil design and then modifying the coil design according to the simulation until the coil design meets specifications as desired. In some cases, as a final step, the optimized coil design is physically produced and tested to insure that the simulation matches the physically measured properties. This procedure can help to optimize the coil design, whether the goal is to optimize and redesign an old coil design on PCB or whether the goal is to design and optimize a new coil design on PCB.

An existing coil design on a PCB can be validated according to algorithm 720 and potentially improved according to algorithm 700. The existing coil design can be extracted, for example, in a Gerber format using electronic design automation (EDA) or computer-aided design (CAD) systems. In some embodiments, inputs of the initial coil design in step 702 of Algorithm 700 or step 722 in algorithm 720 can be performed in the Gerber format. The output design in step 710 can also be in the Gerber format. Gerber formatting is commonly used in CAD/CAM systems and the such for representing printed circuit board design and can be obtained from Ucamco USA, San Francisco, Calif.

As such, an existing design can be extracted from the existing printed circuit board and provided to algorithm 720 in step 722 for validation or to algorithm 700 in step 702. As such, as described above, the performance of the existing design can be performed in step 724 and the actual performance measured in step 728. The simulated and measured responses can be compared in step 730 and the system validated in step 732.

As discussed above, measuring the response in step 728 can include sweeping the metallic target from a start point to an end point with constant air gap. The simulation can be run with the same PCB design with the same Air Gap and with the same target. This process, called a validation processes, is important to understand if the simulation is performing correctly and the simulation reflects all the non-ideality present in the design.

Once the capability to simulate correctly the coils on the PCB has been validated, then existing design can be input to step 702 of algorithm 700 and modified in a way to improve the accuracy, for example the offset and nonlinearity, of the resulting position locating system. This approach can be accomplished automatically in the iterative algorithm illustrated by steps 704, 706, 708 and 712 of FIG. 7A and uses a simulation code in step 704 and a coil design code in step 712 to converge on an optimum design. The improved Design Coil, which is output in step 710, can then be printed on a PCB with the help of an EDA Tool.

A completely new design can be implemented in much the same way that an existing design can be implemented. In particular, the new design can be input to step 702 of algorithm 700 and algorithm 700 can be executed to optimize the coil design. The optimized coil design output in step 710 of algorithm 700 can then be input to algorithm 720 and the design actually produced for testing. Algorithm 720 can then validate operation of the optimized coil design, as discussed above The coil design tool executed in step 712 of algorithm 700 can be used to design the geometrical shape of the sine and cosine on a PCB using the coil design tool of step 712 in accordance with the simulations performed by simulation tools in step 704. The iterative algorithm for optimizing the coil design, as illustrated in algorithm 700, includes the simulation tool in step 704 and the coil design tool of step 712. In particular, algorithm 700 calculates the minimum position error in step 706 and minimizes non idealities of the Rx Coils in steps 706, 708 and 712. With the coordinates obtained after this optimization, PCB can be printed using a commercial EDA tool as in step 710.

Embodiments of the invention can be used to produce coil designs for position locating systems for all the applications that need position sensor technology, torque, torque angle sensors (TAS) and every other application that uses inductive principle and receiver coils on a PCB. The benefits of certain embodiments include having zero offset on both receivers, which means achieving the theoretic limit that is zero. Achieving 0.5% FS error from a starting point of 2.5% FS-3% FS that occurred before the optimized Coil (an improvement of a factor of 6) can be achieved. Further, no linearization or calibration method is needed if the error is reduced well enough. Additionally, the number of trials and errors used to produce a viable coil design can be reduced, providing for a shortened product introduction and time to market.

FIGS. 8A and 8B illustrate an example of a coil layout 800 on a PCB (not shown for clarity) that can be used as an input to algorithm 700 as illustrated in FIG. 7A. In some cases, the optimized coil design resulting from algorithm 720 will be modified by algorithm 700 in order to optimize the accuracy of coil layout 800. FIG. 8A illustrates coil layout 800 while FIG. 8B illustrates a planar view of coil layout 800, which overlaps the traces on the top side and the bottom side of the PCB.

As is illustrated in FIGS. 8A and 8B, coil design 800 includes transmission coil 802, which may include multiple loops and may further include vias through the PCB so that some of the traces for transmission coil 802 is on one side of the PCB while other traces of transmission coil 802 are on the opposite side of the PCB. In some cases, the transmission coil can be optimized to render it as symmetric with respect to the receive coils as possible while minimizing the required space. FIG. 8A illustrates vias 814 and 816 which allow the traces of transmission coil 802 to be connected between sides of the PCB. As is further illustrated in FIGS. 8A and 8B, receive coils include cosine oriented coils 804 and sine oriented coils 806. Cosine oriented coils 804 include vias 818 that allow transition of the wire traces of cosine oriented coils 804 from one side of the PCB to the other. Similarly, sine oriented coils 806 include vias 820 that allow for transition of wiring for sine oriented coils 806 between sides of the PCB.

Another feature that is included in coil layout 800 are the addition of wells 808, 810, and 812 that compensate further for non-uniformity of the fields generated by transmit coils 802 and a resulting offset error generated by that non-uniformity. As is illustrated in coil design 800, well 808 and 810 are provided to adjust sine oriented coil 804 and well 812 is set to adjust cosine oriented coil 806. Further, vias 822 and 824 can be provided so that the traces of wells 808 and 812, respectively, can be on either side of the PCB. Wells 808, 810, and 812 can, for example, compensate for offsets in receive coils 804 and 806 due to non-uniformity in the fields generated by transmit coils 802.

Figure 9A:
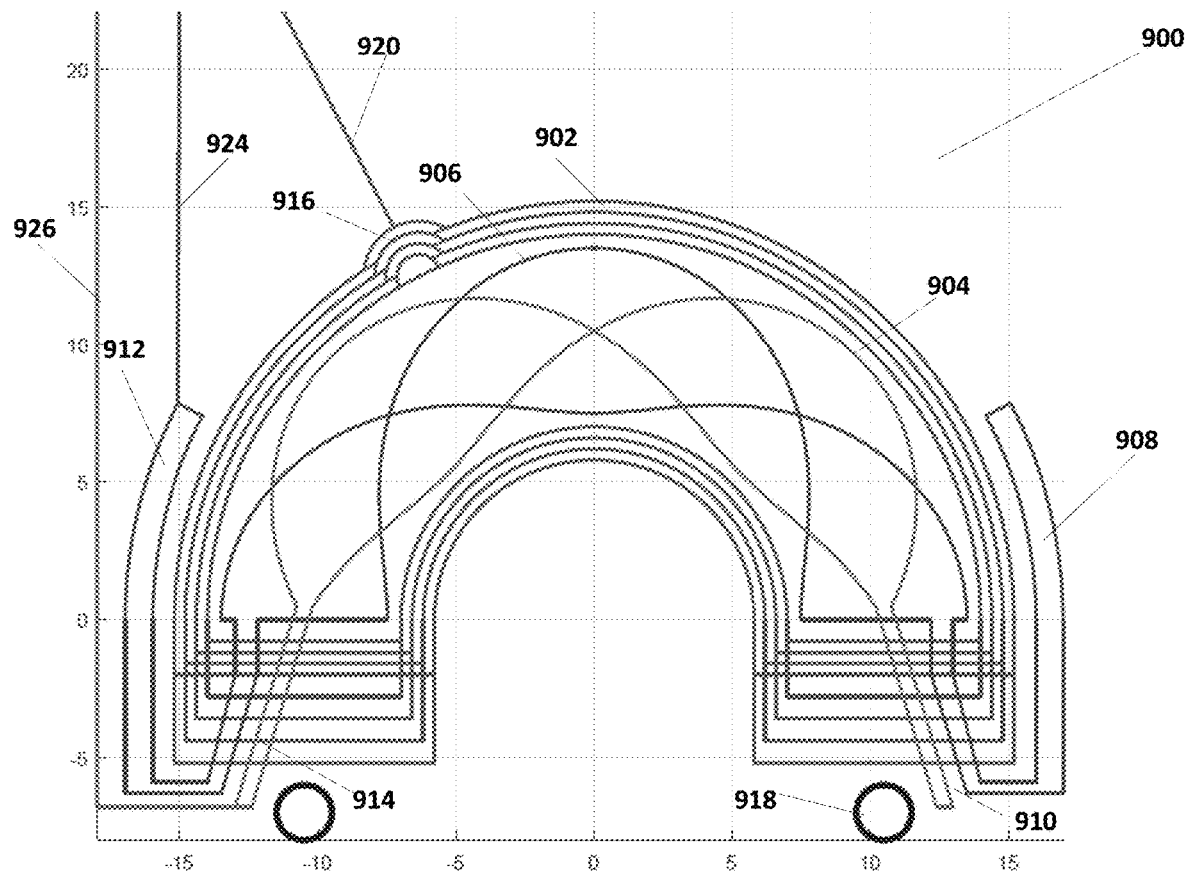
FIGS. 9A, 9B, and 9C illustrate another example coil design according to some embodiments of the present invention.
Figure 9B:
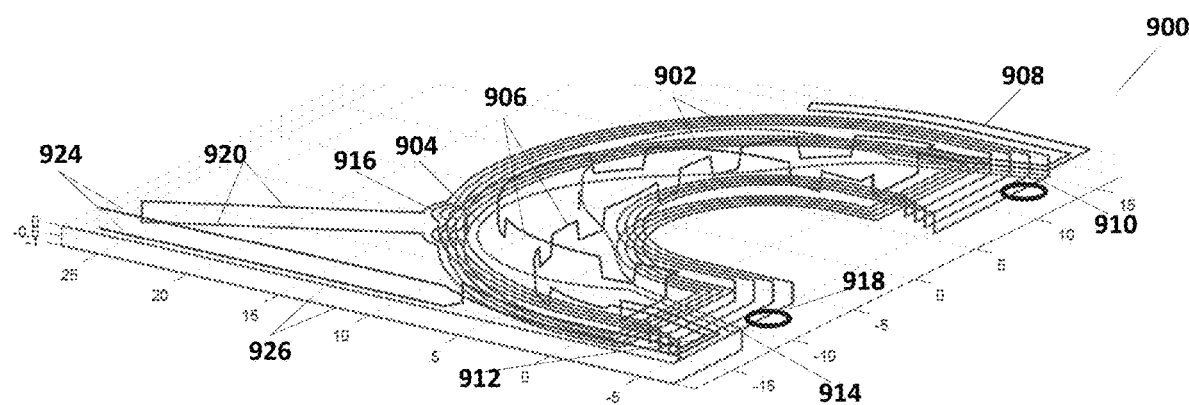
Figure 9C:
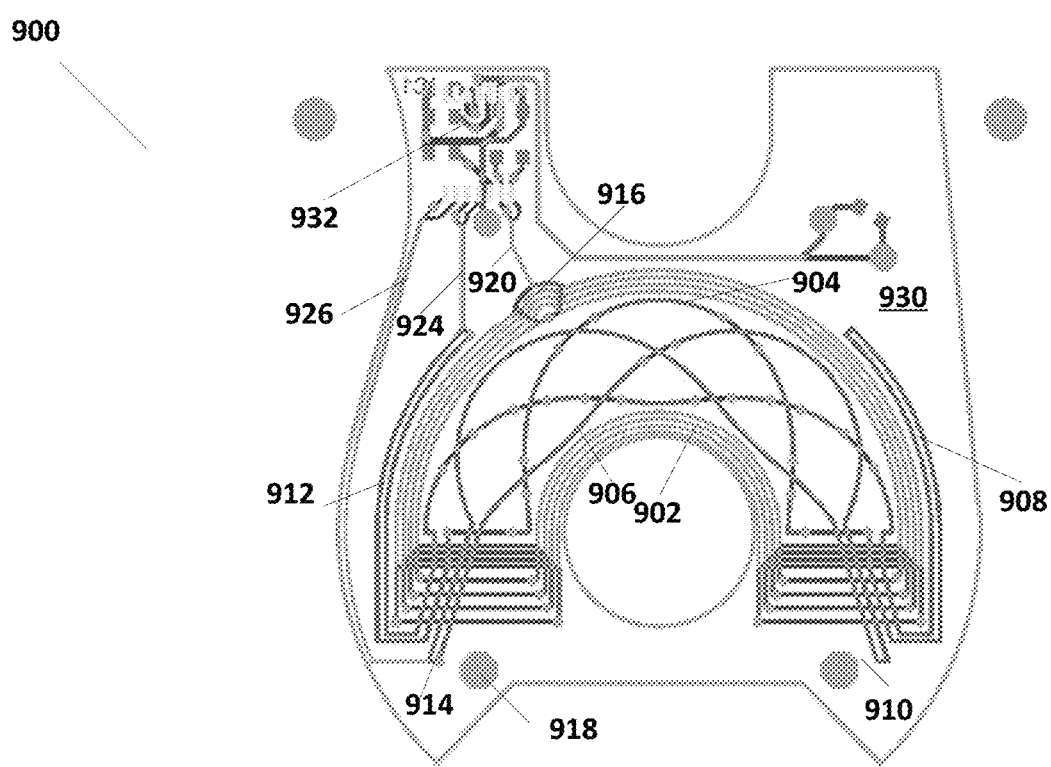

FIGS. 9A, 9B, and 9C illustrate another coil design according to some embodiments of the present invention. As opposed to the linear position system illustrated in coil design 800, coil design 900 illustrated in FIGS. 9A, 9B, and 9C illustrate a rotary position system. As shown in coil design 900, transmission coil 902, cosine oriented receive coil 904 and sine oriented receiver coil 906 are oriented in a circular fashion. Further, transmission coil 902 includes a distortion portion 916 with leads 920. Sine oriented receiver coil 906 includes wells 908 and 912 and is connected to a lead 924. Similarly, cosine oriented receiver coil 904 includes wells 910 and 914 and is coupled to lead 926. The PCB may also have mounting holes 918. FIG. 9A illustrates a planar view of coil design 900 while FIG. 9B illustrates an angled view of coil design 900 that illustrates vias and traces on both sides of a PCB board on which it is formed. FIG. 9C illustrates a plan view of coil design 900 on a printed circuit board 930. Further, a control circuitry 932, coupled to leads 920, 924, and 926, mounted on circuit board 930.

Figure 9D:
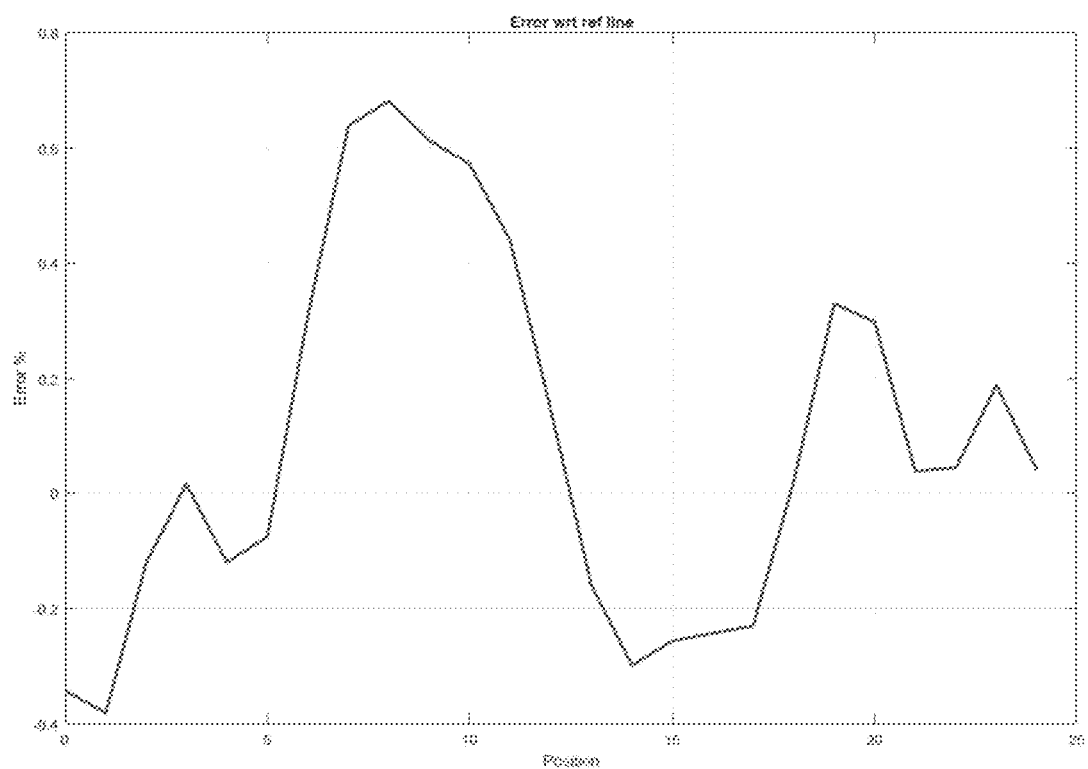
FIGS. 9D and 9E illustrate performance characteristics of a coil design according to some embodiments.
Figure 9E:
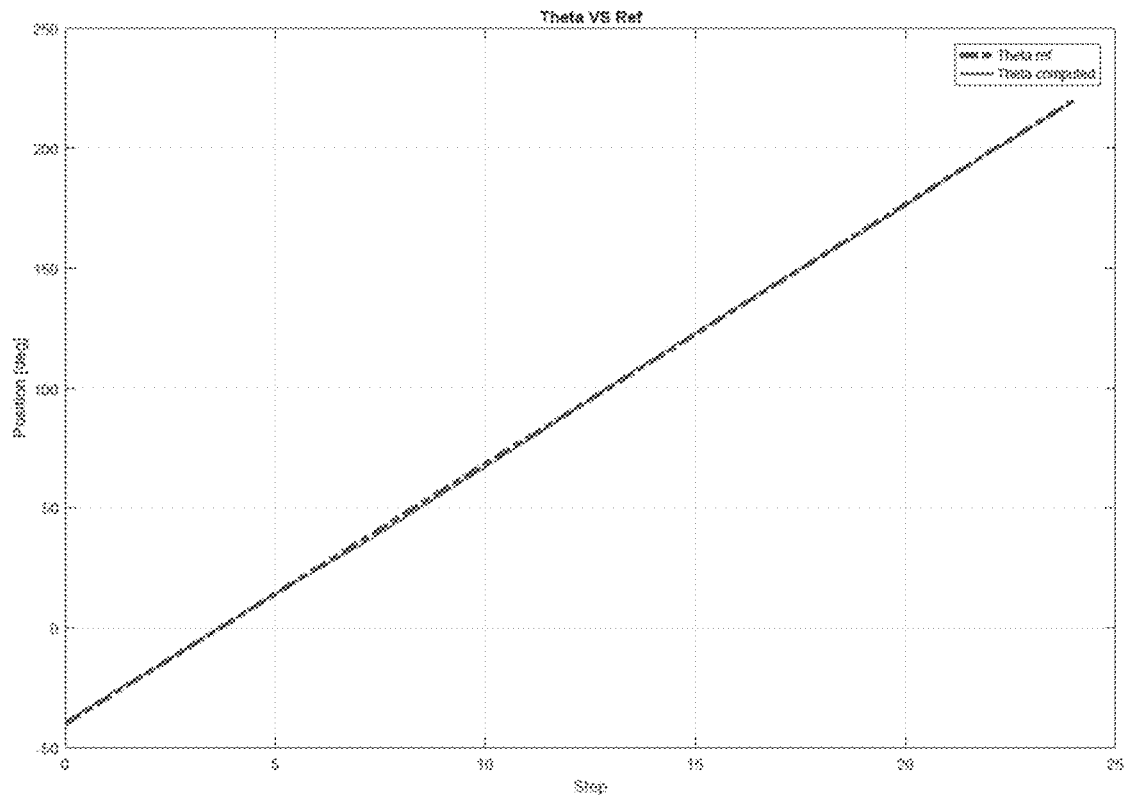

FIG. 9D illustrates the percentage error between the actual position like the one used in positioning system 400, and the position reconstructed by the simulation by using the RX voltages in, for example, step 704 of algorithm 700. As illustrated in FIG. 9D, the percentage error between theoretical and simulated results, after coil design 900 has been optimized according to algorithm 700, is less than 0.7%. FIG. 9E illustrates the actual angular position versus the simulated angular position after coil design 900 has been optimized according to algorithm 700. FIG. 6 illustrates again the percentage of Full Scale error for the optimized coil design 900 after a linearization algorithm has been applied. On that scale, the error is less than 0.3% FS.

Embodiments of the invention include a simulation step 704 that simulates the response of a position locating system coil design and a coil design adjustment algorithm 712 that, using the simulated response, adjusts the coil design for better accuracy. As is discussed above, position sensors suffer from a number of non-idealities. First of all, the field produced by the TX coils is highly non-uniform and because of this non-uniformity the gap between the target and the RX coils allows a lot of magnetic flux not to be correctly shielded by the target. Another effect is that the parts of the RX coils on the bottom of the PCB capture less induced magnetic flux than the corresponding parts in the top of the PCB. Finally, the exits of the RX coils that allow a connection with the controller chip also produce an offset error which is sensible. In the linear and arc sensors, there is additionally the strong effect of the ends of the sensor which produce a huge stray field. This last effect is responsible for most error on the linear and arc designs.

As discussed above, optimization of the coil design begins with a good simulation in step 704 of algorithm 700. In a first iteration, simulation is performed on the initial coil design input in step 702 of algorithm 700. In accordance with some embodiments, simulation includes an eddy current solver algorithm developed at the University of Udine, Italy. In particular, an example of a simulation algorithm uses a Boundary Integral Method (BIM), introduced in the publication P. Bettini, R. Specognz, "A boundary integral method for computing eddy currents in thin conductors for arbitrary topology," IEEE Transactions on Magnetics, Vo. 41, No. 3, 7203904, 2015, which provides a very fast simulation (a couple of tens of seconds for 25 target positions). Such an algorithm can be tailored for simulating traces on PCBs and inductive sensor applications. In particular, the simulation can input the geometry of the PCB traces, the geometry of the metallic target, the air gap, the translation/rotation of the metallic target over the coils formed by the traces, and additional fixed conductors that, for example, can be used to simulate ground planes of the PCT or other conductors nearby the sensor. The simulation can output the simulated voltages from receiver coils at a series of positions of the metallic target over the coils.

In some embodiments, a Finite Element Method (FEM) or analogous method may also be used in this application. However, in some cases large amounts of computing time may be needed to perform these simulations. It would be expected that the calculations for each sensor target position may use two or more orders of magnitude of computational time with respect to the BIM method described above. Further, the mesh of the computation domain may need to be rebuilt from scratch for each target position. Furthermore, accuracy in these techniques may be limited since long and thin conductors require a lot of mesh elements to obtain an accurate solution. These calculations may also be limited by memory and computing time resources.

Figure 10A:
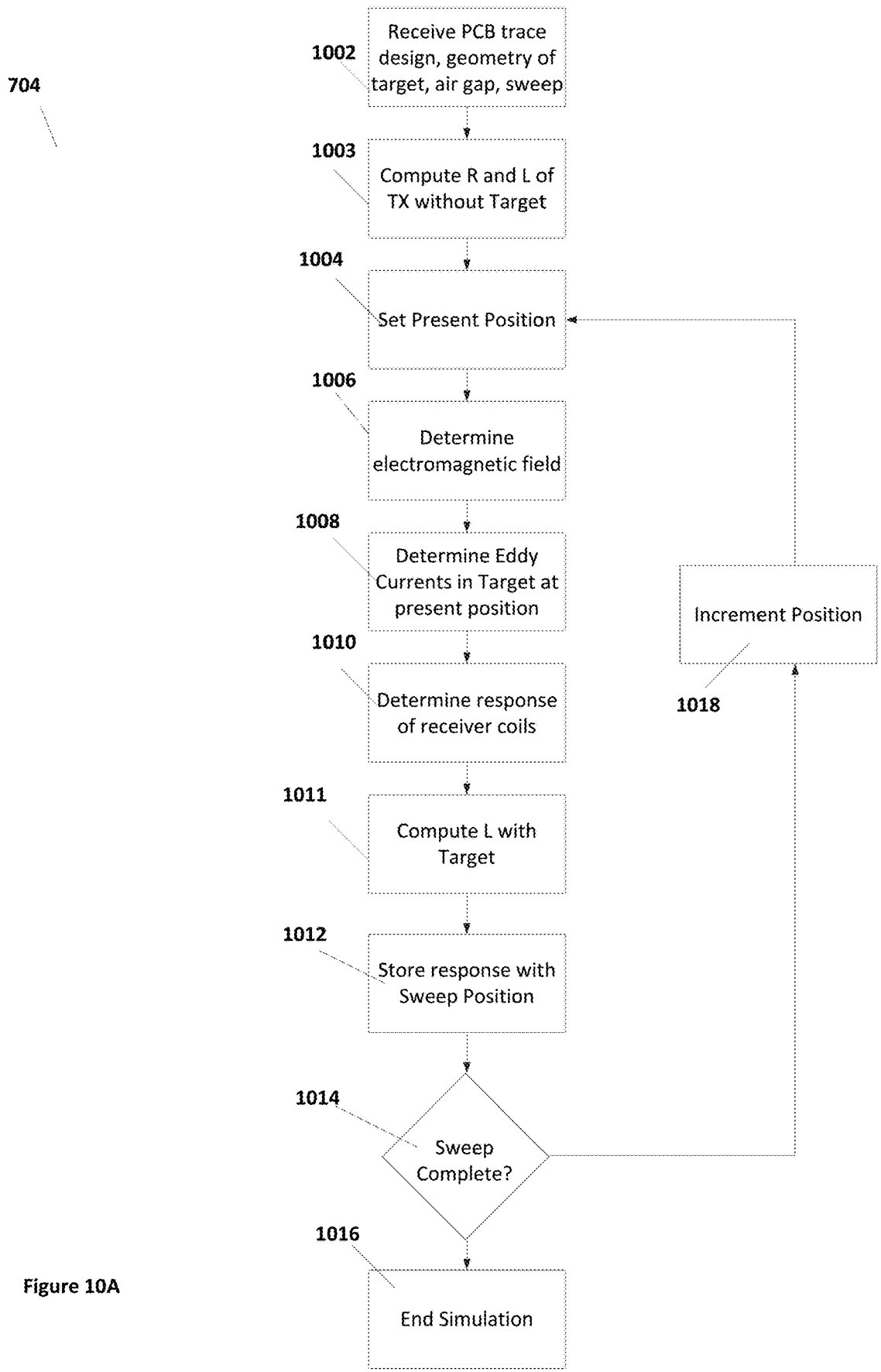
FIG. 10A illustrates a simulation algorithm according to some embodiments.

FIG. 10A illustrates an example of simulation step 704 of algorithm 700. Algorithm 700 as illustrated in the example of FIG. 7A, in effect, substantially compensates for the non-ideal effects described above and produces, therefore, the best possible solutions compatible with the physics of the problem of providing an accurate position location system. To accomplish this, a realistic and efficient numerical model of the position locating system is developed. As discussed in more detail below, in some embodiments traces that form transmit coils, receiver coils, and connecting lines are represented with one-dimensional metallic wires. Some embodiments may use more refined simulation algorithms, for example such as brick volumetric elements, partial elements equivalent circuit (PEEC), or an approach based on volume integral formulations, which may provide further enhancement to estimating the magnetic field produced by actual three dimensional current carrying structures. The metallic target can usually be represented by a conducting surface.

As is illustrated in FIG. 10A, algorithm 704 begins at step 1002. In step 1002, the PCB trace design that describes the TX coil and the RX coils, the geometry of the target, the air gap specifications, and the sweep specification is obtained. These input parameters, for example, can be provided by algorithm 700, either through the initial input during input step 702 of algorithm 700 or from the adjusted coil design from coil adjustment step 712 of algorithm 700, as is illustrated in FIG. 7A. Algorithm 704 then proceeds to step 1003.

In step 1003, algorithm 704 computes the resistance R and inductance L of the traces of the transmission coil (TX) at the frequency parameter set in step 1002. The computation is performed without the presence of the target to give an estimation of the quality factor $Q=2\pi fL/R$.

In step 1004, parameters are set to simulate the performance of a particular coil design and air gap of the coil design received in step 1002 with the metallic target set at a present position as defined in the sweep parameters. If this is the first iteration, the present position is set at the beginning of the sweep defined in the data received in step 1002. Otherwise, the position is set at the currently defined position in the sweep.

In step 1006, the electromagnetic fields generated by the transmission coils are determined. The driving voltages and operating frequency for the transmission coils are received with the other parameters provided in step 1002.

Once the electromagnetic fields from the transmission coil is determined, in step 1008 the eddy currents generated in the metallic target as a result of those fields can be determined. From the eddy currents, the fields generated by the target can be simulated.

In step 1010, the voltages generated in the receiver coils due to the combination of the fields generated by the transmission coil and the fields generated by the induced eddy currents in the metallic target are determined. In step 1011 the computation of the inductance L is performed again for the present position of the target to evaluate the variation of L with respect to the result of step 1003. In step 1012, the response data is stored for future reference.

In step 1014, algorithm 704 checks to see if the sweep has been completed. If not, then algorithm 704 proceeds to step 1018 where the current position of the metallic target is incremented and then to step 1004 where the simulation with that position is started. If the sweep is completed, algorithm 704 proceeds to step 1016 where the simulation ends and the algorithm returns to step 706 of algorithm 700 illustrated in FIG. 7A.

Simulations and reconfiguration of the coils according to the simulations (in FIG. 7A, simulation step 704, comparison step 706, decision step 708, and design adjustment step 712) should be fast enough to test a large number of coil design configurations in a short period of time. Hundreds, or even thousands, of simulations may be used before an optimized coil design is achieved by algorithm 700. Consequently, there are some model simplifications that, although not substantially affecting the accuracy of the simulation, can substantially increase the speed. If each simulation takes 10 seconds to complete, for example, an optimization that uses 100 iterations may take 16 minutes. If each simulation takes 10 minutes to complete, however, that same optimization may take 16 hours to complete.

An effective simplification used in some embodiments is to represent the conducting traces used in formation of transmit coils and receiver coils with a one-dimensional wire model. In a worst-case deviation from a one-dimensional wire model, consider a benchmark rectangular trace with a height of 35 μm and a width of 0.3 mm. The rectangular trace can be formed of any non-magnetic conductive material, for example copper. Other metals may be used to form traces, but copper is more typical. The current density of current flowing within the rectangular trace can be very uniform for a section of the trace with thickness on the order of twice the skin depth. For copper, the skin depth is 30 μm at a frequency of 5 MHz. Consequently, for the benchmark rectangular trace discussed above, the current density within the trace will be substantially uniform.

Figure 10B:
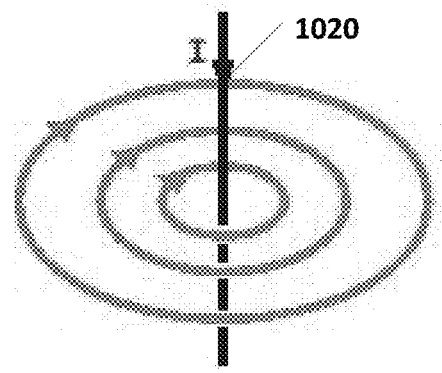
FIGS. 10B and 10C illustrate the fields generated around a wire and the fields generated around a rectangular trace.
Figure 10C:
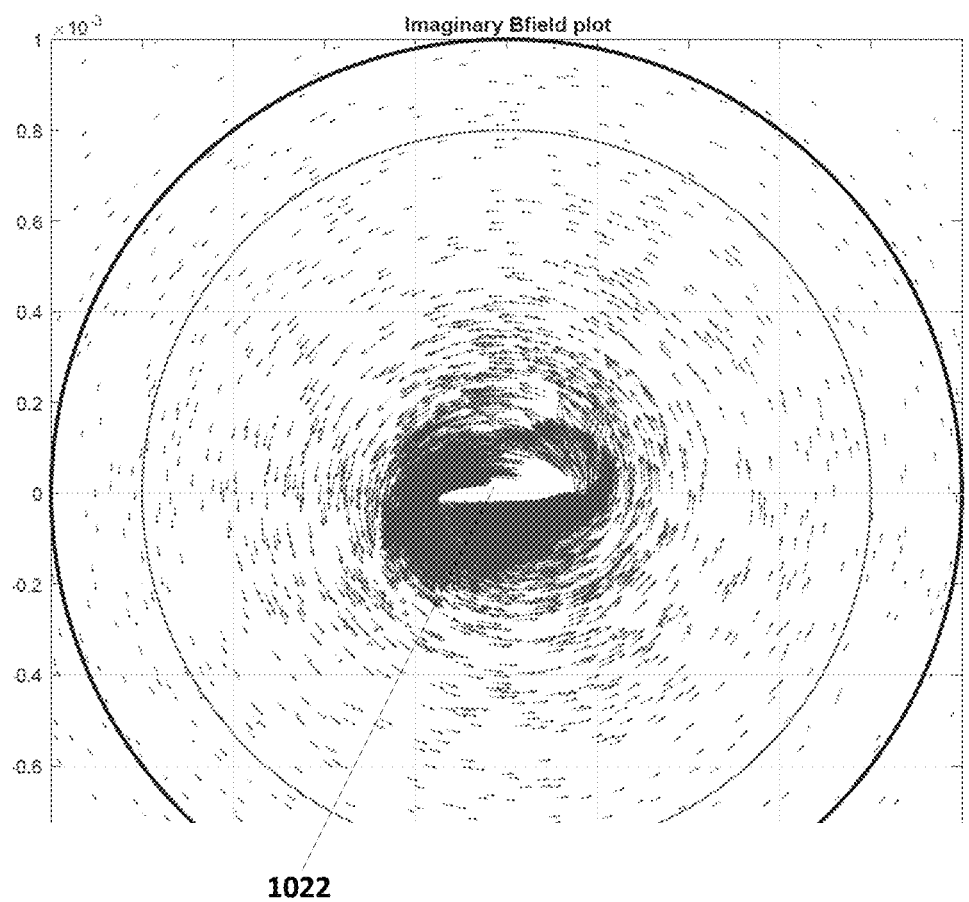

FIG. 10B illustrates the field generated by a current carrying one-dimensional wire 1020. There is no difference in the field generated by wire 1020 or by a straight cylinder of a diameter, if the current flowing in the two structures is the same. FIG. 10C, however, illustrates the field generated around benchmark trace 1022, which is the benchmark trace described above formed of copper and with height of 35 μm and width of 0.3 mm. As is illustrated in FIG. 10C, the field even at short distances of less than 1 mm looks the same as that generated by wire 1020 in FIG. 10B. The difference is in the fields less than about 1 mm from the trace.

Figure 10D:
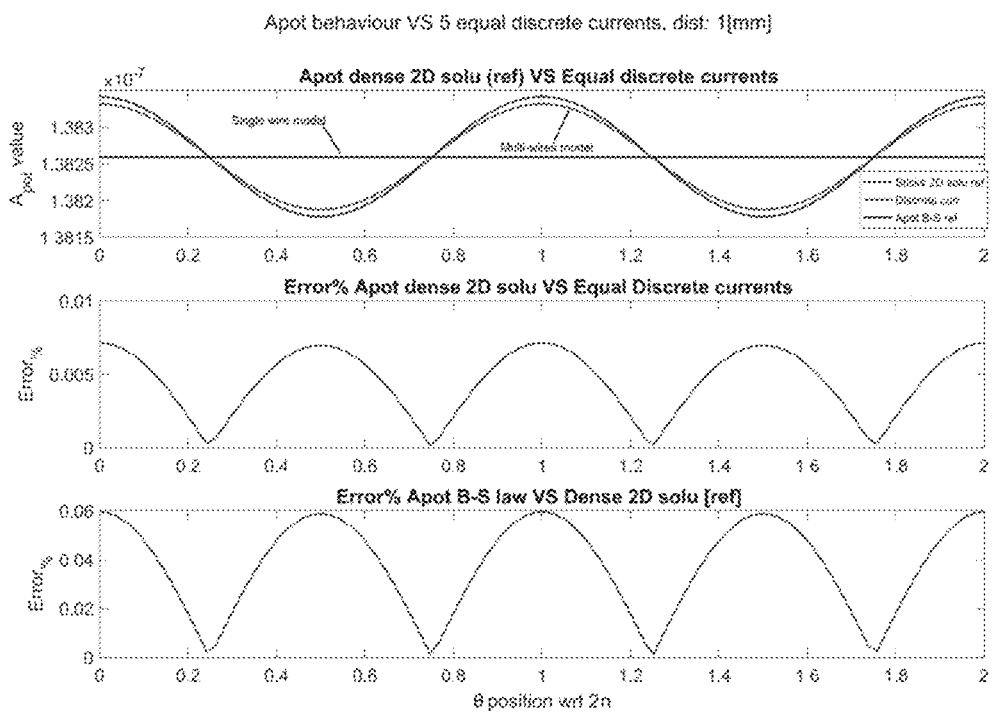
FIGS. 10D and 10E illustrate an error generated by treating a rectangular trace as a one-dimensional wire, multi-wires, or 3D bricks.

FIG. 10D illustrates the difference between a one-dimensional model of wire 1020 and the benchmark rectangular trace 1022 at a distance of 1 mm from the center of the trace. The representation of a singular rectangular trace 1022 can be realized both with a single-wire and a multi-wire configuration. As can be seen, the field deviates slightly from the one-dimensional model. As can be seen from FIG. 10D, the error is not negligible, but in both cases it is a small fraction of 1% even at 1 mm. Since most points of the receive coils are much further than 1 mm away with respect to transmission coils, the 1d-wire model may suffice in most applications.

Figure 10E:
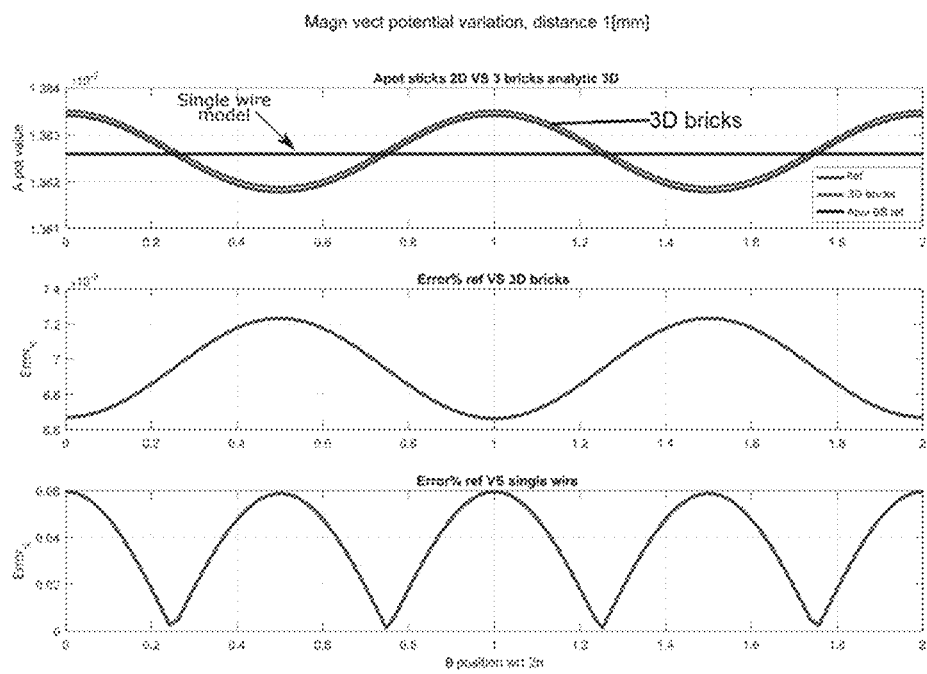

It is also possible to represent the transmission coil with three-dimensional brick shaped elements in which the current density is assumed to be uniform. FIG. 10E illustrates this approximation. As is illustrated in FIG. 10E, this reduces the modeling error of the magnetic field produced by the transmission coil by one order of magnitude at a modest additional computational price.

Consequently, in step 1006 and in step 1010, the traces can be modeled as one-dimensional traces. The source magnetic field produced by the transmit coil is therefore pre-computed by using the 1d-wire model. In some embodiments, more advanced models based on 3D brick elements, which as discussed above can produce roughly the same results, can be used. These models may use a finite-element-matrix form of computations, however such models may need many elements and require a significant increase in computation. As discussed above, FEM-like models may use too many elements (100+millions mesh elements) to reach the precision of the proposed one-dimensional model.

Figure 10F:
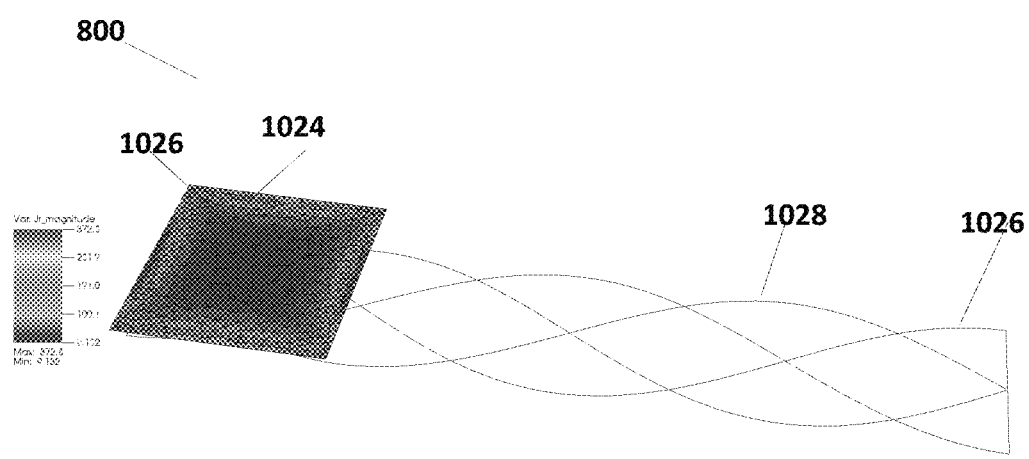
FIG. 10F illustrates a simulation of eddy currents in a metallic target over receiver coils.

FIG. 10F illustrates positioning of a metallic target 1204 over receiver coils 1028 and 1026 in a position location system design that is being simulated in algorithm 704. For purposes of discussion, FIG. 10F illustrates an example of coil design 800 illustrated in FIGS. 8A and 8B, with receiver coils 1028 and 1026 corresponding with the one-dimensional approximation to the traces of receiver coils 804 and 806, respectively. Transmit coil 802 is not illustrated in FIG. 10F for simplification of the illustration, but the traces of transmit coil 802 is also approximated by one-dimensional wire traces.

After the electromagnetic fields from the target coil 802 of the position locating system 800 have been simulated, then in step 1008 of the example of algorithm 704 illustrated in FIG. 10A, the eddy currents of the metallic target 1024 are simulated and the electromagnetic fields that result from those eddy currents are determined. The induced eddy currents in metallic target 1024, in some embodiments, are computed by an original Boundary Integral Formulation.

Metallic target 1024 can typically be modeled as a thin metal sheet. Usually, metallic target 1024 is thin, 35 μm to 70 μm, while the lateral dimensions are typically measured in millimeters. As discussed above with respect to wire traces, when conductors have a thickness less than about twice the penetration depth of the magnetic field at a particular operating frequency, the induced current density is substantially uniform across the layer thickness. Therefore, the thin conductor of metallic target 1024 can be modeled as a surface in which the induced eddy currents are tangent to the surface. If this is not the case, the more computationally expensive Volumetric Integral Formulations like, the one provided in P. Bettini, M. Passarotto, R. Specogna, "A volume integral formulation for solving eddy current problems on polyhedral messes," IEEE Transactions on Magnetics, Vol. 53, No. 6, 7204904, 2017, or Finite Element modeling can be used to model the target.

As is further illustrated in FIG. 10F, the surface of metallic target 1024 is represented as covered by mesh elements 1026. Mesh elements 1026 are non-overlapping polygons, typically triangular, that cover the entire surface of metallic target 1024 and form a discrete surface.

Once the simulation on metallic target 1024 is performed in step 1008 of 704, as illustrated in FIG. 10A, then in step 1010 the response of receiver coils 804 and 806 is simulated. As is further illustrated in algorithm 704, simulation 704 sweeps the target across position locator system 800 and estimates "in silico" the voltages on the receive coils 804 and 806 for all specified positions of the target 1024.

As is further illustrated in step 712 of algorithm 700 illustrated in FIG. 7A, the shape of receive coils 804 and 806, assuming that transmit coil is adapted in the best possible way to all non-idealities of the sensor 800 at the same time. This represents the best solution, given that the non-idealities cannot be all removed and as discussed above several approximations are used in simulation algorithm 704.

Figure 11:
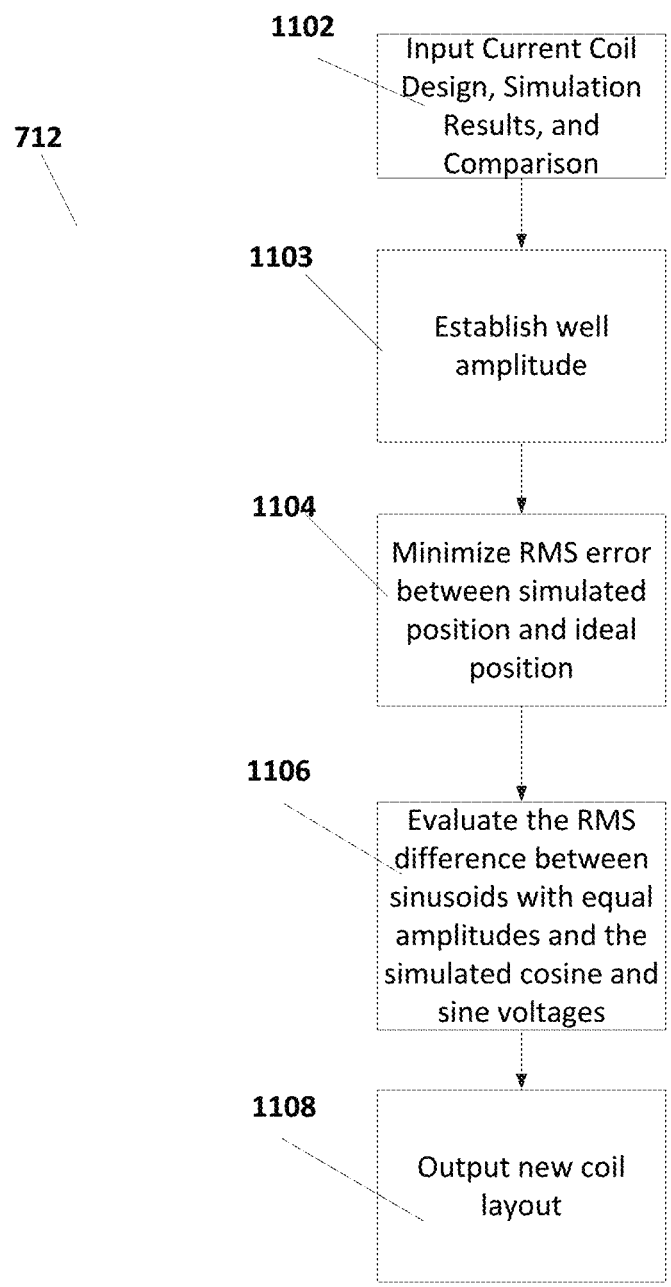
FIG. 11 illustrates an algorithm for adjusting the receiver coil design according to some embodiments.
Figure 14:
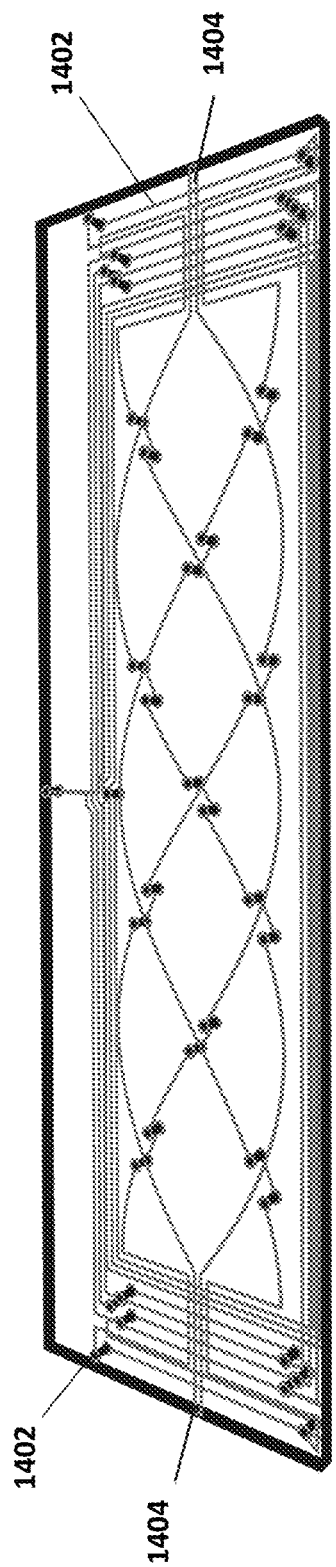
FIG. 14 illustrates an optimized design with wells.

FIG. 11 illustrates an example of algorithm 712. In algorithm 712, the centerline of the receive coils 804 and 806 traces and transmit coil 802 are represented as one-dimensional pathways. Splines or any other interpolation function can be used to link the one-dimensional pathways to form the shape of transmit coil 802 and receive coils 804 and 806. More efficiently, the distortion of the receive coils may be realized by the application of a suitable function. For example, in the rotary sensor the function will be a function of the radius. In step 1102, the current coil design layout, the simulation results, and in some cases the comparison provided in step 706 are input and received in algorithm 712. A non-linear programming solver can then be used to find the shape of transmit coil 802 and receive coils 804 and 806 that minimize a given objective function. The objective function is formed by three parts as illustrated in FIG. 11. In step 1103 the width of the external wells 1402 and 1404 illustrated in FIG. 14 is established in order to minimize the offset without the target. In step 1104, the root mean square of error (RMS) between the detected position (i.e. the electrical angle) and the ideal one is minimized. This does not impose anything about the shape of the voltage $V_{cos}$ and $V_{sin}$ with respect to position. In step 1106, algorithm 712 evaluates the RMS of the difference between two sinusoids with equal amplitude and the simulated values of V cos and V sin as a function of position in order to constrain the shape of the output voltages. In some embodiments, the shape of the redesigned receive coils 804 and 806 may converge in both steps 1104 and 1106. In step 1108, the new coil layout is output.

In some embodiments, steps 1104 and 1106 may use Metaheuristic optimization solvers. Metaheuristic optimization solvers tend to be very slow, however. Therefore, in some embodiments metaheuristic global searching technique like genetic algorithms or particle swarm algorithms can be used. In some embodiments, a deterministic algorithm like the interior point method or the trust region algorithm can be used in steps 1104 and 1106. In particular, since initial starting designs for receive coils 804 and 806 can be standard sine and cosine profiles, and the resulting optimized design should result in a small perturbation of the initial design, then it is expected that local search methods can be used to sufficiently find the global minima resulting in optimal designs. The basics of optimization theory can be found, for example, in S. S. Rao, Engineering Optimization: Theory and Practice, John Wiley & Sons, 2009.

Figure 12:
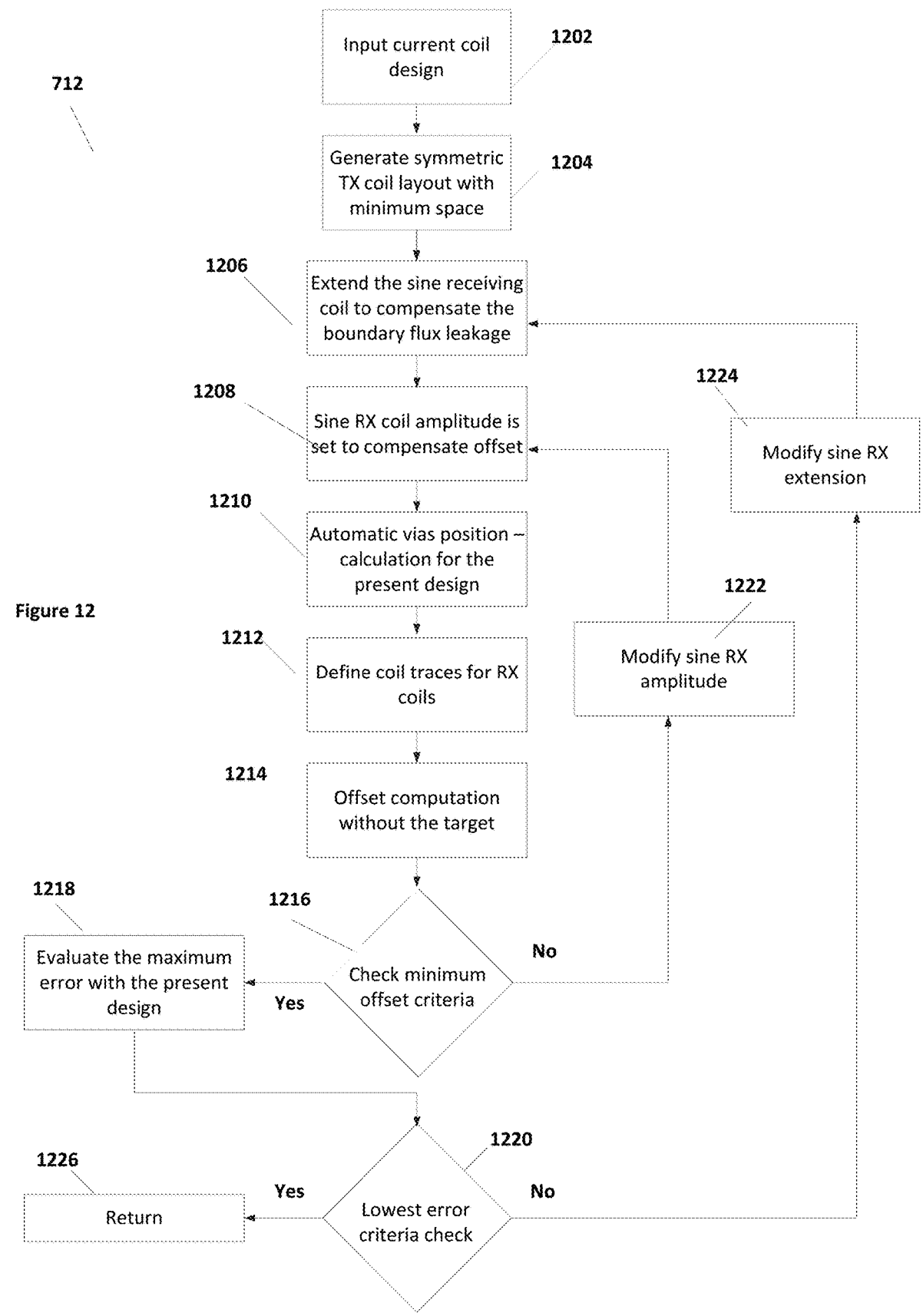
FIG. 12 illustrates another embodiment of an algorithm for adjusting the receiver coil design according to some embodiments.

FIG. 12 illustrates another embodiment of algorithm 712. The input provided in step 1202 is the same as that discussed with respect to step 1102 of FIG. 11. In step 1204, the transmission coil (TX) is automatically generated providing the maximum symmetry and reducing the space required.

Figure 13:
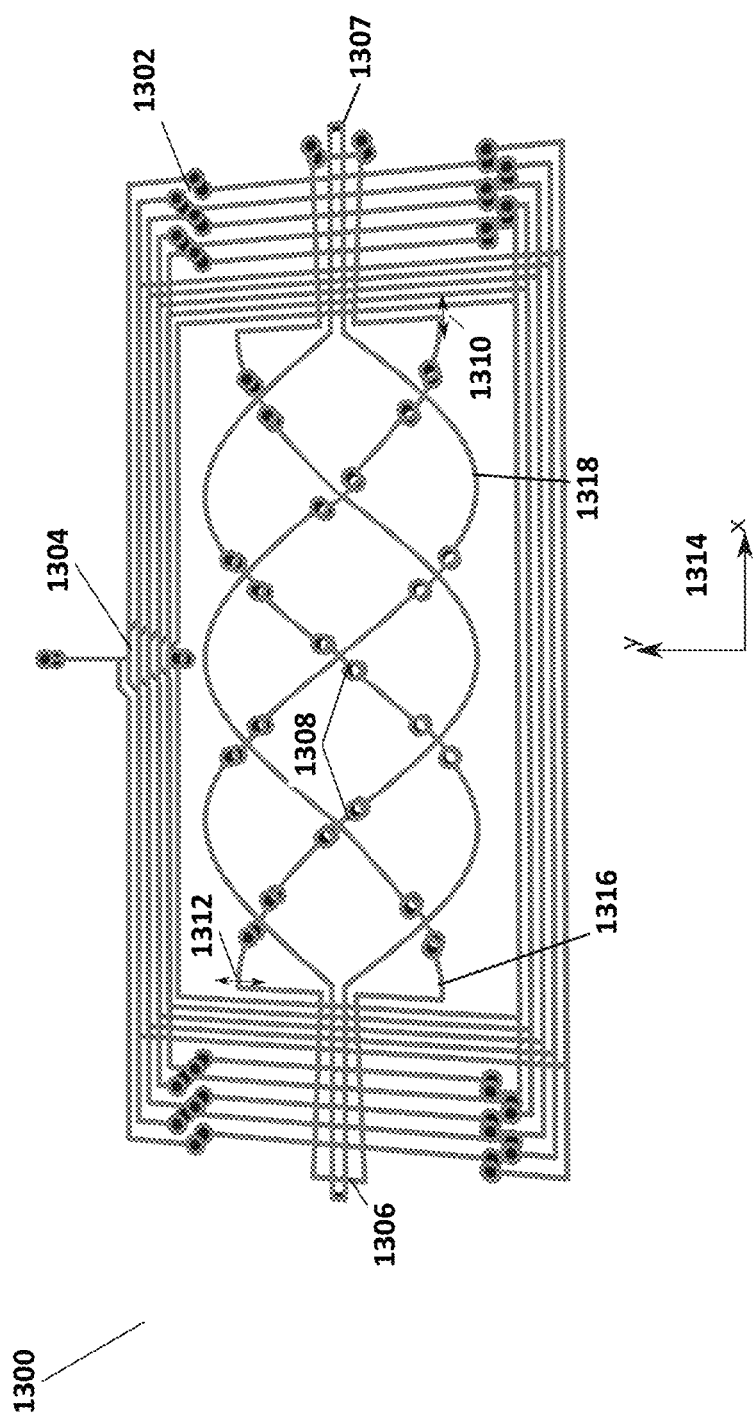
FIG. 13 illustrates optimizing a design without wells.

An example transmission coil that can result is shown in FIG. 13 where the trace deviation 1304 is computed according to the PCB specifications in term of trace to trace distance and vias dimensions (pad radius). Moreover, a reduction of the space can be obtained with the alternate vias positioning 1302.

In the embodiment of algorithm 712 illustrated in FIG. 12, the algorithm adjusts the sine receive coil and the cosine receive coil is defined relative to the modified sine receive coil. One skilled in the art will recognize that instead of modifying the sine receive coil, the cosine receive coil could be modified instead and the sine receive coil defined relative to the cosine receive coil. For illustrative purposes, FIG. 13 illustrates the modification 1300 of a sine receive coil as described with respect to FIG. 12.

Receiving coils (RX) design can be defined with a double loop iteration. Initially, in step 1206, the sine shaped RX coil 1316 is symmetrically partially extended along x direction (with the reference system 1314) as in trace 1310 to compensate the flux leakage due to the target non-idealities. With the imposed coil extension, in step 1208 the sine shaped coil 1316 is then deformed along y direction as in trace 1312 using a proper displacement function acting on all the points of the coil 1316. Given these settings, in step 1210 the algorithm computes the position of the vias. The vias position 1308 is established according with information specified in step 1202 and in order to eliminate the signal mismatch previously mentioned. Voltage mismatch appears whenever there are more vias in one receiver coil than there are in the other receiver coil or the vias are positioned in an unbalanced way (i.e. not symmetric). The voltage mismatch that results is a greater peak-to-peak amplitude of the sine signal with respect to the cosine signal (or vice versa) when the target is moving. To achieve the goal of reducing voltage mismatch, the vias are designed in such a way that the length of the parts of the SIN (1316) and COS (1318) RX coils in the bottom of the PCB is the same. Moreover, the vias are symmetric with respect to the symmetry center of the design.

In step 1212, the sine and cosine receive coil traces are defined. In some embodiments, a one-dimensional model is used to define the traces.

In step 1214, algorithm 712 computes the offset without the target and in step 1216 if the minimum offset criterion is not satisfied the algorithm restarts from step 1208 after modifying the sine RX extension in step 1224. When the minimum offset is reached the algorithm proceeds to step 1218, evaluating the voltages as described in FIG. 10A and then computing the maximum error between the ideal and the simulated positions. If the lowest possible error is not reached in step 1220, the algorithm goes back to step 1206 after modifying the sine RX amplitude in step 1222, providing another configuration. Once the lowest error for the current input is obtained the algorithm ends at return step 1226.

In some embodiments the offset without target compensation is realized without the presence of the wells as illustrated in FIG. 13. Anyway, the design symmetry is always guaranteed thanks to the balanced extensions 1306 and 1307 of the sine shaped 1316 and cosine shaped 1318 RX coils.

The above detailed description is provided to illustrate specific embodiments of the present invention and is not intended to be limiting. Numerous variations and modifications within the scope of the present invention are possible. The present invention is set forth in the following claims.

What is claimed is:

1. A method of providing an optimized position locating sensor coil design, comprising:
   receiving into a computing system a coil design and a desired specification for the accuracy of the position locating sensor coil design, the coil design being represented in a datafile to provide transmit coil, sine coil, and cosine coil coordinates;

simulating, in the computing system, position determination over a range of positions of a metallic target with respect to the coil design to form a simulated performance of the coil design, the simulated performance representing the simulated response of the sine coil and cosine coil to the metal target excited by the transmit coil over the range of positions;

comparing, in the computer system, the simulated response with the desired specification for the accuracy to provide a comparison;

modifying, in the computer system, the coil design based on the comparison between the simulated performance and the desired specification to arrive at an updated coil design that performs closer to the desired specification for the accuracy; and providing the updated coil design;

wherein the coil design and the updated coil design includes a transmit coil layout, a sine receive coil layout, a cosine receive coil layout, a metallic target geometry, a sweep geometry, and an air gap, and wherein simulating position determination includes, for each of a set of positions within the range of positions of a metallic target over the coil design, computing parameters for the transmit coil in the absence of the sine receive coil and the cosine receive coil;

determining an electromagnetic field produced by the transmit coil;

determining eddy currents induced in the metallic target by the electromagnetic field produced by the transmit coil at a present location from the set of positions of the target;

determining a response of the sine receiver coil and the cosine receiver coil produced by the eddy currents in the metallic target;

computing a second set of parameters for the transmit coil with the metallic target; and storing the voltage signals as a function of the position of the metallic target.

2. The method of claim 1, further including:
repeating the simulating, comparing, and modifying steps on the updated coil designs to arrive at a final coil design with optimized performance that meets the desired specification for the accuracy; and
providing the final design for printing on a printed circuit board.

3. The method of claim 1, wherein determining eddy currents includes simulating the metallic target with a boundary-integral-method.

4. The method of claim 1, further including:
physically producing a position locating system according to the final design; and
validating the position locating system against simulated results of the stored voltage signals.

5. A method of providing an optimized position locating sensor coil design, comprising:
receiving into a computing system a coil design and a desired specification for the accuracy of the position locating sensor coil design, the coil design being represented in a datafile to provide transmit coil, sine coil, and cosine coil coordinates;
simulating, in the computing system, position determination over a range of positions of a metallic target with respect to the coil design to form a simulated performance of the coil design, the simulated performance representing the simulated response of the sine coil and cosine coil to the metal target excited by the transmit coil over the range of positions;
comparing, in the computer system, the simulated response with the desired specification for the accuracy to provide a comparison;
modifying, in the computer system, the coil design based on the comparison between the simulated performance and the desired specification to arrive at an updated coil design that performs closer to the desired specification for the accuracy; and
providing the updated coil design,
wherein the coil design and the updated coil design includes a transmit coil layout, a sine receive coil layout, a cosine receive coil layout, a metallic target geometry, a sweep geometry, and an air gap, and
wherein each of the receive coils includes one or more wells.

6. The method of claim 5, further including:
repeating the simulating, comparing, and modifying steps on the updated coil designs to arrive at a final coil design with optimized performance that meets the desired specification for the accuracy; and
providing the final design for printing on a printed circuit board.

7. The method of claim 5, further including:
physically producing a position locating system according to the final design; and
validating the position locating system against simulated results of the stored voltage signals.

8. A method of providing an optimized position locating sensor coil design, comprising:
receiving into a computing system a coil design and a desired specification for the accuracy of the position locating sensor coil design, the coil design being represented in a datafile to provide transmit coil, sine coil, and cosine coil coordinates;
simulating, in the computing system, position determination over a range of positions of a metallic target with respect to the coil design to form a simulated performance of the coil design, the simulated performance representing the simulated response of the sine coil and cosine coil to the metal target excited by the transmit coil over the range of positions;
comparing, in the computer system, the simulated response with the desired specification for the accuracy to provide a comparison;
modifying, in the computer system, the coil design based on the comparison between the simulated performance and the desired specification to arrive at an updated coil design that performs closer to the desired specification for the accuracy; and
providing the updated coil design,
wherein the coil design and the updated coil design includes a transmit coil layout, a sine receive coil layout, a cosine receive coil layout, a metallic target geometry, a sweep geometry, and an air gap, and
wherein traces of the transmit coil and traces of the receive coils are treated as one-dimensional wires.

9. The method of claim 8, further including:
repeating the simulating, comparing, and modifying steps on the updated coil designs to arrive at a final coil design with optimized performance that meets the desired specification for the accuracy; and
providing the final design for printing on a printed circuit board.

10. The method of claim 8, further including:
physically producing a position locating system according to the final design; and validating the position locating system against simulated results of the stored voltage signals.

11. A method of providing an optimized position locating sensor coil design, comprising:
receiving into a computing system a coil design and a desired specification for the accuracy of the position locating sensor coil design, the coil design being represented in a datafile to provide transmit coil, sine coil, and cosine coil coordinates;
simulating, in the computing system, position determination over a range of positions of a metallic target with respect to the coil design to form a simulated performance of the coil design, the simulated performance representing the simulated response of the sine coil and cosine coil to the metal target excited by the transmit coil over the range of positions;
comparing, in the computer system, the simulated response with the desired specification for the accuracy to provide a comparison;
modifying, in the computer system, the coil design based on the comparison between the simulated performance and the desired specification to arrive at an updated coil design that performs closer to the desired specification for the accuracy; and
providing the updated coil design,
wherein the coil design and the updated coil design includes a transmit coil layout, a sine receive coil layout, a cosine receive coil layout, a metallic target geometry, a sweep geometry, and an air gap, and
wherein modifying the coil design comprises:
establishing well amplitude for the sine receive coil and the cosine receive coil;
minimizing a root mean square (RMS) error between a simulated position and an ideal position;
evaluating a root mean square distance between sinusoids and the simulated cosine and sine voltages; and
providing the updated coil design.

12. The method of claim 11, minimizing the RMS error and the RMS distance is accomplished with a metaheuristic optimization solver.

13. The method of claim 11, further including:
repeating the simulating, comparing, and modifying steps on the updated coil designs to arrive at a final coil design with optimized performance that meets the desired specification for the accuracy; and
providing the final design for printing on a printed circuit board.

14. The method of claim 11, further including:
physically producing a position locating system according to the final design; and
validating the position locating system against simulated results of the stored voltage signals.

15. A method of providing an optimized position locating sensor coil design, comprising:
receiving into a computing system a coil design and a desired specification for the accuracy of the position locating sensor coil design, the coil design being represented in a datafile to provide transmit coil, sine coil, and cosine coil coordinates;
simulating, in the computing system, position determination over a range of positions of a metallic target with respect to the coil design to form a simulated performance of the coil design, the simulated performance representing the simulated response of the sine coil and cosine coil to the metal target excited by the transmit coil over the range of positions;
comparing, in the computer system, the simulated response with the desired specification for the accuracy to provide a comparison;
modifying, in the computer system, the coil design based on the comparison between the simulated performance and the desired specification to arrive at an updated coil design that performs closer to the desired specification for the accuracy; and
providing the updated coil design,
wherein the coil design and the updated coil design includes a transmit coil layout, a sine receive coil layout, a cosine receive coil layout, a metallic target geometry, a sweep geometry, and an air gap, and
wherein modifying the coil design comprises:
generating a symmetric transmit coil layout with minimum space;
extending a receive coil according to a boundary flux leakage;
setting the receive coil amplitude according to an offset;
calculating symmetric via positions that avoids a voltage mismatch;
defining coil traces for the receive coil and a second receive coil; and
calculating an offset without the presence of the target.

16. The method of claim 15, further including:
checking minimum offset criteria; and
modifying the amplitude of the receive coil if the minimum is not met.

17. The method of claim 16, further including if the minimum offset criteria is met, evaluating the maximum error and modifying the receive coil design if the lowest criteria is not met.

18. The method of claim 15, further including:
repeating the simulating, comparing, and modifying steps on the updated coil designs to arrive at a final coil design with optimized performance that meets the desired specification for the accuracy; and
providing the final design for printing on a printed circuit board.

19. The method of claim 15, further including:
physically producing a position locating system according to the final design; and
validating the position locating system against simulated results of the stored voltage signals.

* * * * *